(12) United States Patent
Kang et al.

(10) Patent No.: US 11,780,451 B2
(45) Date of Patent: Oct. 10, 2023

(54) METHOD FOR OPERATING HOST DEVICE AND MEMORY DEVICE AND VEHICLE COMPRISING THE HOST DEVICE AND MEMORY DEVICE

(71) Applicant: Samsung Electronics Co., Ltd., Suwon-si (KR)

(72) Inventors: Young San Kang, Yongin-si (KR); Kwang Won Park, Suwon-si (KR); Byung Yo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 21 days.

(21) Appl. No.: 17/456,408

(22) Filed: Nov. 24, 2021

(65) Prior Publication Data

US 2022/0332330 A1 Oct. 20, 2022

(30) Foreign Application Priority Data

Apr. 19, 2021 (KR) .......................... 10-2021-0050324

(51) Int. Cl.
*B60W 50/00* (2006.01)
*B60W 60/00* (2020.01)

(52) U.S. Cl.
CPC ............ *B60W 50/00* (2013.01); *B60W 60/00* (2020.02); *B60W 2050/0083* (2013.01)

(58) Field of Classification Search
CPC ..................................................... B60W 50/00
See application file for complete search history.

(56) References Cited

U.S. PATENT DOCUMENTS

| | | | |
|---|---|---|---|
| 7,386,041 B2 | 6/2008 | Nygaard | |
| 8,860,477 B2 | 10/2014 | Hashida | |
| 9,112,671 B2 | 8/2015 | Wei et al. | |
| 10,014,907 B2 * | 7/2018 | Choi | H04B 3/46 |
| 10,341,147 B1 | 7/2019 | Khare et al. | |
| 10,408,863 B2 | 9/2019 | Jeter et al. | |
| 10,515,028 B2 | 12/2019 | Jeter et al. | |
| 2022/0332330 A1 * | 10/2022 | Kang | B60W 60/00 |
| 2022/0391141 A1 * | 12/2022 | Hong | G06F 3/0659 |

FOREIGN PATENT DOCUMENTS

KR 101114117 B1 2/2012

\* cited by examiner

*Primary Examiner* — Michael A Berns
(74) *Attorney, Agent, or Firm* — Myers Bigel, P.A.

(57) ABSTRACT

A method for operating a host device and a memory device, and a vehicle including the host device and the memory device are provided. The method for operating a host device includes detecting a need for an EOM (Eye Open Monitor) operation, transmitting a command for requesting the EOM operation to a memory device in response to the detection of the need to perform the EOM operation, and receiving a response signal including changed preset information from the memory device.

20 Claims, 28 Drawing Sheets

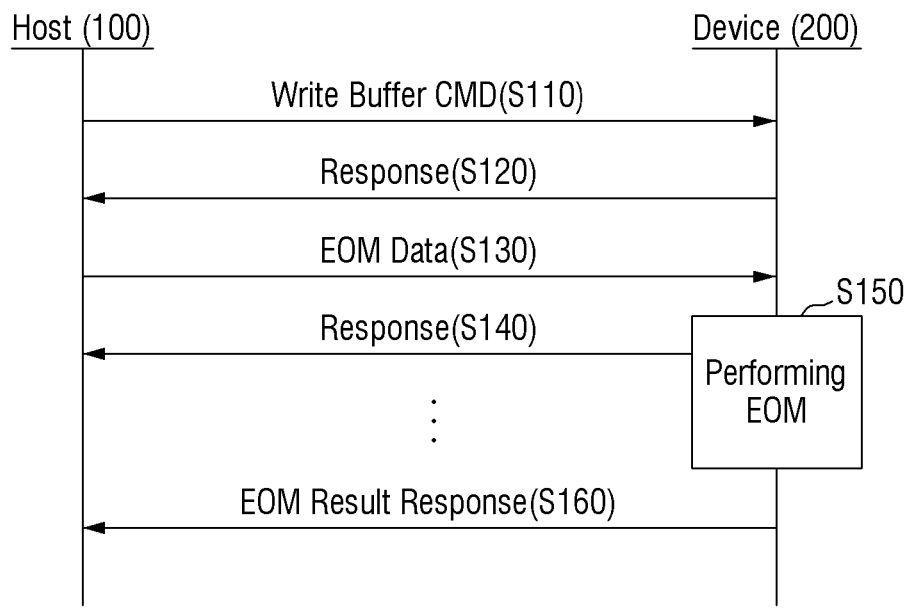

FIG. 10

| MODE | DESCRIPTION |
|------|-------------|
| 00h | Not used in UFS |
| 01h | Vendor Specific |
| 02h | Data |
| ... | Not used in UFS |
| 0Eh | Download microcode with offsets, save and defer active |
| ... | Not used in UFS |
| 1Dh | Reserved |
| 1Eh | Reserved |
| 1Fh | EYE OPEN MONITOR |

FIG. 11

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | EOM DATA LENGTH (N-11) | | | | | | |
| 2 | | | | | | | | (LSB) | |
| 3 | PHASE SELECT | | | | | | | | |
| 4 | VREF CONTROL | | | | | | | | |
| 5 | NUMBER OF SAMPLING | | | | | | | | ⎬ EDH |
| 6 | VREF RESOLUTION | | | | PHASE RESOLUTION (GEAR) | | | | |
| 7 | Reserved = 00h | | | | | | | | |
| 8 | Reserved = 00h | | | | | | | | |
| 9 | Reserved = 00h | | | | | | | | |
| 10 | Reserved = 00h | | | | | | | | |
| 11 | Reserved = 00h | | | | | | | | ⎭ |

| Byte | | |
|---|---|---|
| 12 | Data[0] | ⎫ |
| ... | ... | ⎬ EDP |
| N | Data[EOM DATA LENGTH - 1] | ⎭ |

FIG. 13

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | Total Data Length (N+1) | | | | | | |
| 2 | | | | | | | | (LSB) | |
| 3 | (MSB) | | | | | | | | |
| 4 | | | EOM Data Pattern Length (N-11) | | | | | | |
| 5 | | | | | | | | (LSB) | ⎬ EDH |
| 6 | Timing Step ||||||||  |
| 7 | Voltage Step |||||||| |
| 8 | Number of Sampling |||||||| |
| 9 | Timing Offset |||||||| |
| 10 | Voltage Offset |||||||| |
| 11 | Reserved 1 |||||||| ⎭ |
| 12 | |||||||| ⎫ |
| 13 | |||||||| |
| 14 | |||||||| |
| 15 | |||||||| |
| 16 | |||||||| |
| 17 | |||||||| |
| 18 | |||||||| |
| 19 | EOM Data Pattern |||||||| ⎬ EDP |
| 20 | |||||||| |
| 21 | |||||||| |
| 8 | |||||||| |
| N-2 | |||||||| |
| ... | |||||||| |
| N | |||||||| ⎭ |

FIG. 14

Response UPIU

| | | | | | | | |
|---|---|---|---|---|---|---|---|
| 0 | | 1 | | 2 | | 3 | |
| xx10 0001b | | Flags | | LUN | | Task Tag | |
| 4 | | 5 | | 6 | | 7 | |
| IID | Command Set Type | Reserved | | Response | | Status | |
| 8 | | 9 | | 10 | | 11 | |
| Total EHS Length (00h) | | Device Information | | Data Segment Length | | | |
| 12 (MSB) | | 13 | | 14 | | 15 (LSB) | |
| Residual Transfer Count | | | | | | | |
| 16 | | 17 | | 18 | | 19 | |
| Reserved | | | | | | | |
| 20 | | 21 | | 22 | | 23 | |
| Reserved | | | | | | | |
| 24 | | 25 | | 26 | | 27 | |
| Reserved | | | | | | | |
| 28 | | 29 | | 30 | | 31 | |
| Reserved | | | | | | | |
| Header E2ECRC (omit if HD=0) | | | | | | | |
| k | | k+1 | | k+2 | | k+3 | |
| Sense Data Length | | | | Sense Data[0] | | Sense Data[1] | |
| k+4 | | k+5 | | k+6 | | k+7 | |
| Sense Data[2] | | Sense Data[3] | | Sense Data[4] | | Sense Data[5] | |
| ... | | ... | | ... | | ... | |
| k+16 | | k+17 | | k+18 | | k+19 | |
| Sense Data[14] | | Sense Data[15] | | Sense Data[16] | | Sense Data[17] | |
| Data E2ECRC (omit if DD=0) | | | | | | | |

NOTE 1 k = 32 if HD = 0.

FIG. 17

| Preset | Local TX Amplitude | Local TX De-Emphasis Gain | Local TX PLL B/W(KHz) | Remote RX CTLE DC Gain | Remote RX CTLE AC Gain |
|---|---|---|---|---|---|
| P00 | 350 | 0 | 250 | -4 | 0 |
| P01 | 350 | 0 | 350 | -4 | 3 |
| P02 | 350 | 0 | 600 | -4 | 6 |
| P03 | 350 | 3.5 | 250 | 0 | 0 |
| P04 | 350 | 3.5 | 350 | 0 | 3 |
| P05 | 350 | 3.5 | 600 | 0 | 6 |
| P06 | 350 | 6.0 | 250 | 6 | 0 |
| P07 | 350 | 6.0 | 350 | 6 | 3 |
| P08 | 350 | 6.0 | 600 | 6 | 6 |
| P09 | 400 | 0 | 250 | -4 | 0 |
| ⋮ | ⋮ | ⋮ | ⋮ | ⋮ | ⋮ |
| P35 | 500 | 6.0 | 600 | 6 | 6 |
| P36 | 550 | 0 | 250 | -4 | 0 |
| P37 | 550 | 0 | 350 | -4 | 3 |
| ⋮ | ⋮ | ⋮ | ⋮ | ⋮ | ⋮ |

FIG. 20

| Preset | Width (mUI) | Height (mV) | Vertical Midium | Pass Grids Number | Score |
|---|---|---|---|---|---|
| P00 | 472 | 140 | 0 | 1892 | 329.2 |
| P01 | 477 | 143 | 0 | 1953 | 338.3 |
| P02 | 500 | 142 | 5 | 2033 | 845.3 |
| P03 | 475 | 152 | 7 | 2067 | 358.7 |
| P04 | 474 | 153 | 0 | 2077 | 360.7 |
| P05 | 470 | 148 | 5 | 1992 | 347.2 |
| P06 | 475 | 184 | 3 | 2503 | 434.3 |
| P07 | 507 | 188 | 0 | 2729 | 967.9 |
| P08 | 510 | 187 | 0 | 2731 | 970.1 |
| P09 | 540 | 162 | -3 | 2505 | 952.5 |
| ⋮ | ⋮ | ⋮ | ⋮ | ⋮ | ⋮ |
| P35 | 550 | 177 | -22 | 2788 | 0 |
| P36 | 563 | 175 | -2 | 2821 | 1020.1 |
| P37 | 554 | 176 | -2 | 2792 | 1009.2 |
| ⋮ | ⋮ | ⋮ | ⋮ | ⋮ | ⋮ |

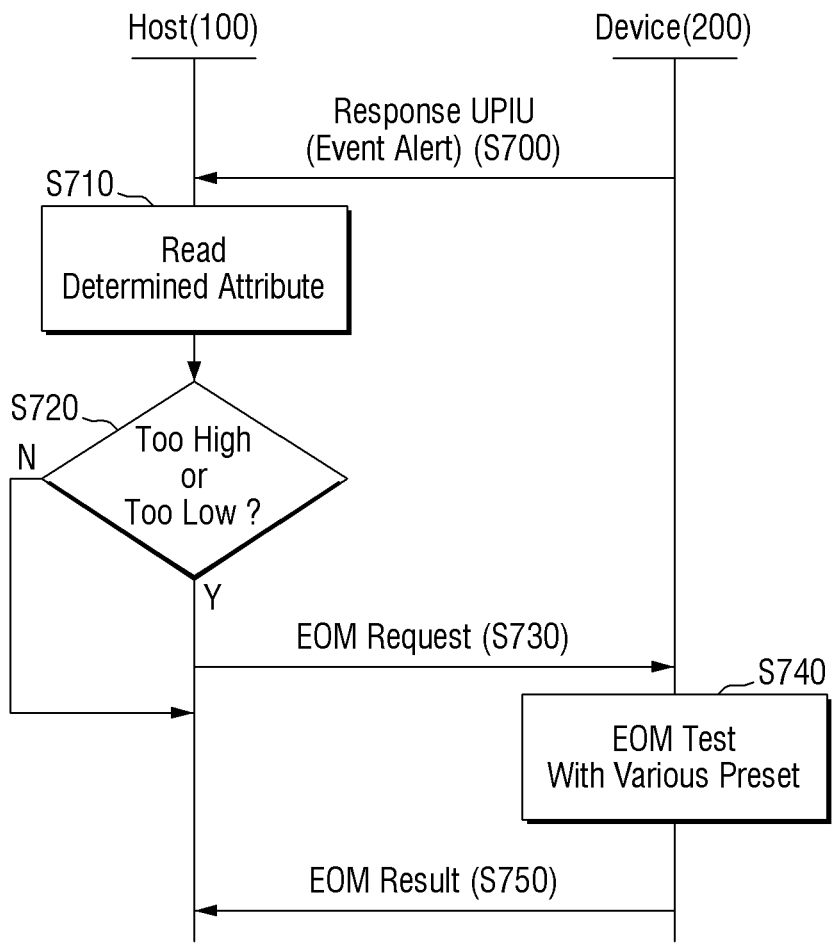

FIG. 27

| ATTRIBUTES | | | | | | | |
|---|---|---|---|---|---|---|---|
| IDN | Name | Access Property | Size | Type<br># Ind.<br># Sel. | MDV | Description | Notes |
| 0Eh | wException EventStatus | | 2 bytes | D | 0000h | Each bit represents an exception event. A bit will be set only if the relevant event has occurred (regardless of the wExceptionEventControl Status).<br>Bit 0: DYNCAP_NEEDED<br>Bit 1: SYSPOOL_EXHAUSTED<br>Bit 2: URGENT_BKOPS<br>Bit 3: TOO_HIGH_TEMP<br>Bit 4: TOO_LOW_TEMP<br>Bit 5: WRITEBOOSTER_FLUSH_NEEDED<br>Bit 6: PERFORMANCE_THROTTLING<br>Bit 7-15: Reserved | |

METHOD FOR OPERATING HOST DEVICE AND MEMORY DEVICE AND VEHICLE COMPRISING THE HOST DEVICE AND MEMORY DEVICE

RELATED APPLICATION

This application claims priority from Korean Patent Application No. 10-2021-0050324 filed on Apr. 19, 2021 in the Korean Intellectual Property Office, the disclosure of which is incorporated herein by reference in its entirety.

BACKGROUND

1. Technical Field

The present disclosure relates to a method for operating a host device and a memory device, and to a vehicle including the host device and the memory device.

2. Related Art

An EOM (Eye Open Monitor) is used to grasp quality characteristics of signals transmitted to and received from a channel. For example, an eye of a signal received at a signal receiving end of a memory system (e.g., a receiver of data from the memory device) may be measured to improve the quality of signal transmission and reception between the memory device and the host device.

Even if the EOM is operated to search for an optimum preset and the preset is set as a parameter to perform data communication, it may be necessary to change the preset based on changes in the operating environment of an electronic device. Research is being conducted on technologies that may actively change the data communication environment based on the operating environment of the electronic device.

SUMMARY

Aspects of embodiments of the present invention provide a method for driving a host device that may actively change the data communication environment based on the operating environment of the electronic device.

Aspects of embodiments of the present invention also provide a method for driving a memory device that may actively change the data communication environment based on the operating environment of the electronic device.

Aspects of embodiments of the present invention also provide a vehicle that may actively change the data communication environment based on the operating environment of the electronic device.

According to some aspects of the present inventive concept, there is provided a method for operating a host device comprising detecting a need to perform an EOM (Eye Open Monitor) operation, transmitting a command requesting the EOM operation to a memory device in response to the detection of the need to perform the EOM operation, and receiving a response signal including changed preset information from the memory device.

According to some aspects of the present inventive concept, there is provided a method for operating a memory device comprising receiving a first command for requesting a first EOM operation from a host device, performing the first EOM operation by a currently set preset, performing a second EOM operation after changing the currently set preset to a first preset in response to a performance result of the first EOM operation being equal to or less than a predetermined reference value, and transmitting a response signal including the first preset information to the host device.

According to some aspects of the present inventive concept, there is provided a vehicle comprising an electronic control unit, and a memory device configured to receive and store data from the electronic control unit, wherein the memory device is configured to provide the electronic control unit with a response including information indicating that the memory device operates at a predetermined first temperature or lower or operates at a predetermined second temperature or higher, wherein the memory device is configured to receive a first command for requesting a first EOM operation from the electronic control unit, wherein the memory device is configured to perform the first EOM operation by a currently set preset, wherein the memory device is configured to change the currently set preset to a first preset, and then to perform a second EOM operation, in response to a performance result of the first EOM operation being equal to or less than a predetermined reference value, and wherein the memory device is configured to transmit a response signal including the first preset information to the electronic control unit.

However, aspects of embodiments of the present invention are not restricted to the ones set forth herein. These and other aspects of embodiments of the present invention will become more apparent to one of ordinary skill in the art to which the present invention pertains by referencing the detailed description of embodiments of the present invention given below.

BRIEF DESCRIPTION OF THE DRAWINGS

These and other aspects and features of the present invention will become more apparent by describing in detail exemplary embodiments thereof referring to the attached drawings, in which:

FIG. 8 is a flowchart that illustrates example operations of the memory system according to some embodiments of the inventive concept;

FIGS. 9 to 14 are diagrams that illustrates operations of the memory system according to some embodiments of the inventive concept;

FIGS. 17 to 20 are diagrams that illustrate the phy training operations of FIG. 16 according to some embodiments of the inventive concept;

FIG. 25 is a flowchart that illustrates the preset changing method according to some further embodiments of the inventive concept;

FIGS. 26 to 28 are diagrams that illustrate the preset changing method of FIG. 25 according to some embodiments of the inventive concept;

DETAILED DESCRIPTION OF THE EMBODIMENTS

Hereinafter, embodiments according to the technical idea of the present invention will be described referring to the accompanying drawings. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
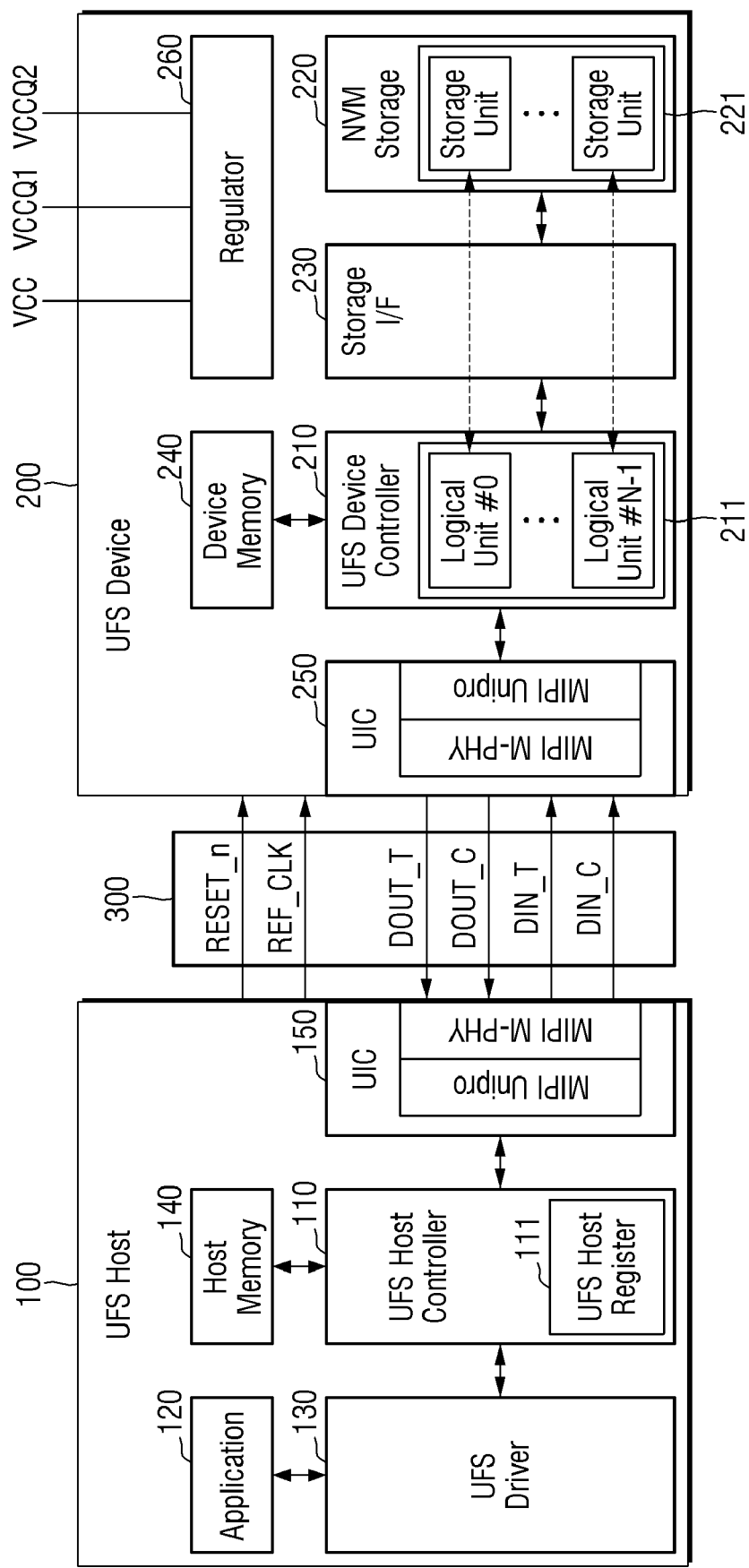
FIG. 1 is a diagram illustrating a memory system according to some embodiments of the inventive concept.
Figure 2:
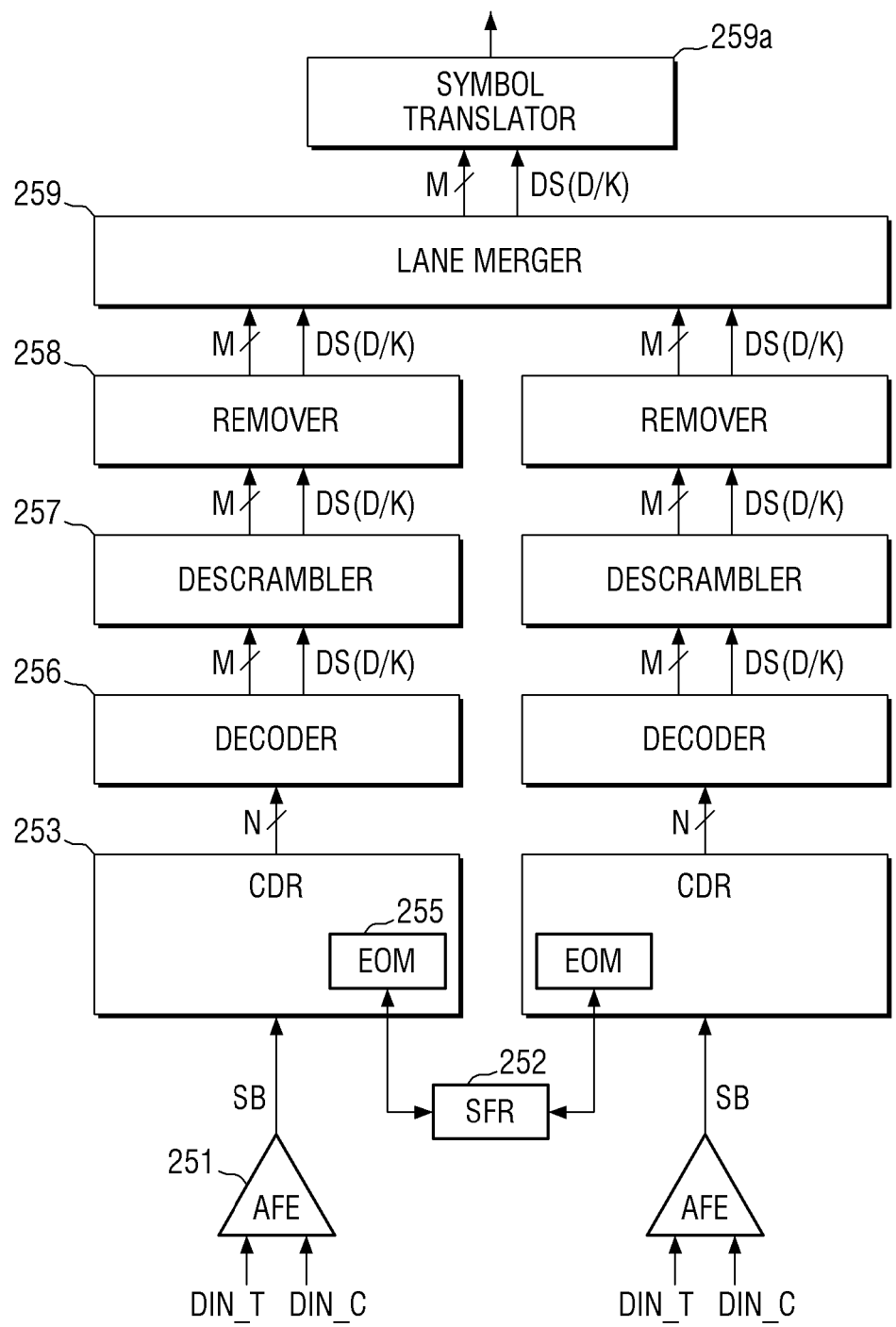
FIG. 2 is a diagram illustrating a UIC (UFS interconnect) layer of FIG. 1.
Figure 3:
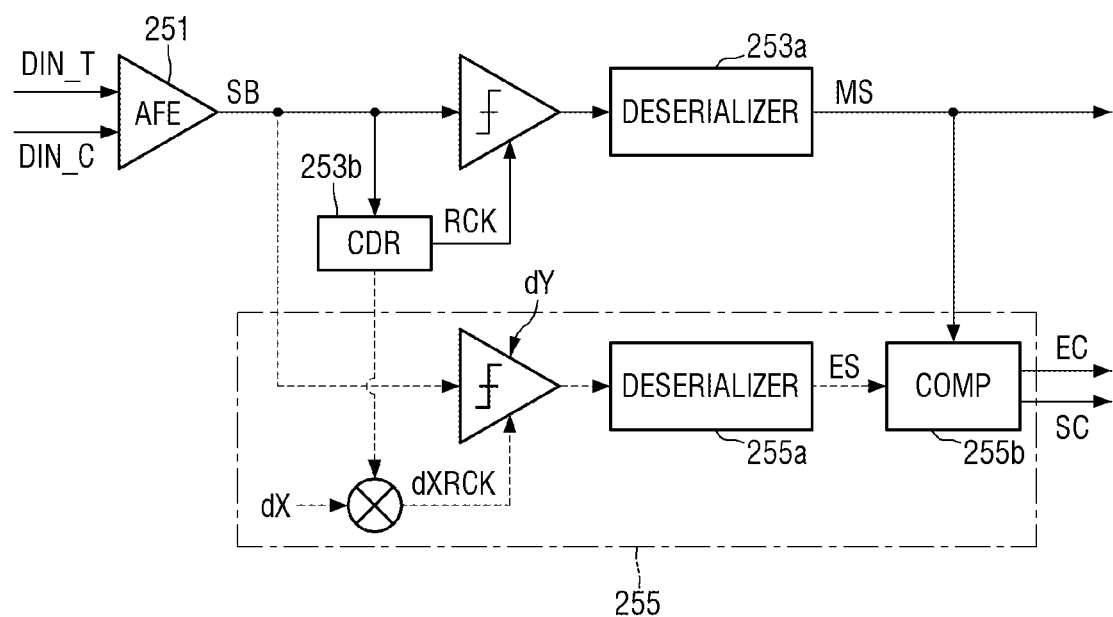
FIG. 3 is a diagram illustrating a CDR block of FIG. 2.
Figure 4:
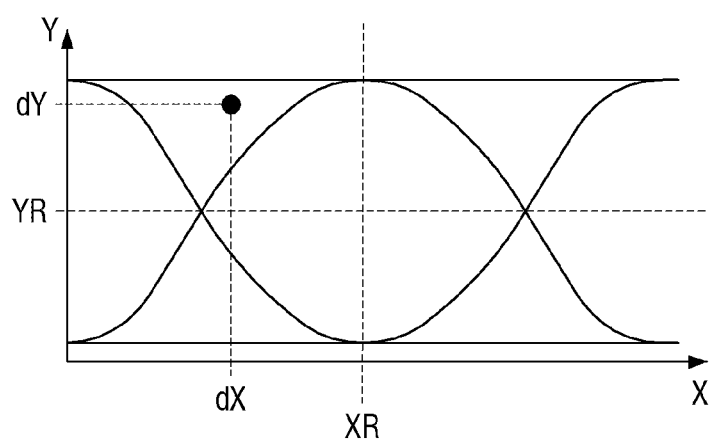
FIG. 4 is a diagram that illustrates EOM operations according to some embodiments of the inventive concept.

FIG. 1 is a diagram illustrating a memory system according to some embodiments of the inventive concept. FIG. 2 is a diagram illustrating a UIC (UFS interconnect) layer of FIG. 1 according to some embodiments of the inventive concept. FIG. 3 is a diagram illustrating a CDR block of FIG. 2 according to some embodiments of the inventive concept. FIG. 4 is a diagram that illustrates EOM operations according to some embodiments of the inventive concept.

Hereinafter, although a memory system according to some embodiments of the inventive concept will be described by using an example of a system that complies with a UFS (Universal Flash Storage) standard announced at JEDEC (Joint Electron Device Engineering Council), the embodiments of the inventive concept are not limited thereto, and the aspects of the memory system according to embodiments of the inventive concept may be implemented with various modifications.

Referring to FIG. 1, the UFS system 1 may include a host device 100, a memory device 200, and a UFS interface 300.

The host device 100 and the memory device 200 may be connected to each other through the UFS interface 300. In some embodiments, the host device 100 may be implemented as a part of an application processor.

The host device 100 may include a UFS host controller 110, an application 120, a UFS driver 130, a host memory 140, and a UIC (UFS interconnect) layer 150.

The memory device 200 may include a UFS device controller 210, a non-volatile storage 220, a storage interface 230, a device memory 240, a UIC layer 250, and a regulator 260.

The non-volatile storage 220 may be made up of a plurality of storage units 221. Although such a storage unit 221 may include a V-NAND flash memory of 2D structure or 3D structure, it may also include other types of non-volatile memory such as a PRAM and/or a RRAM.

The UFS device controller 210 and the non-volatile storage 220 may be connected to each other through the storage interface 230. The storage interface 230 may be implemented to comply with standards, such as Toggle or ONFI. The communication operations between the UFS device controller 210 and the non-volatile storage 220 using Toggle will be described below.

The application 120 may mean a program that is stored in a computer readable medium, is executable by a processor, and is configured to communicate with the memory device 200 to utilize the functions of the memory device 200. The application 120 may transmit an input-output request (IOR) to the UFS driver 130 for input and output to and from the memory device 200. The input-output request (IOR) may include, but is not necessarily limited to, a data read request, a write request and/or an erase request, or the like.

The UFS driver 130 may manage the UFS host controller 110 through a UFS-HCI (host controller interface). The UFS driver 130 may be configured to convert the input-output request generated by the application 120 into UFS commands defined by the UFS standard, and may send the converted UFS commands to the UFS host controller 110. A single input-output request may be converted into a plurality of UFS commands. The UFS commands may be commands defined by a SCSI (Small Computer System Interface) standard, but may also be UFS standard-only commands.

The UFS host controller 110 may be configured to transmit the UFS commands converted by the UFS driver 130 to the UIC layer 250 of the memory device 200 through the UIC layer 150 and the UFS interface 300. In this procedure, the UFS host register 111 of the UFS host controller 110 may act as a command queue (CQ).

The UIC layer 150 on the host device 100 side may include a MIPI M-PHY and a MIPI UniPro, and the UIC layer 250 on the memory device 200 side may also include a MIPI M-PHY and a MIPI UniPro.

The UFS interface 300 may include a line that transmits a reference clock REF CLK, a line that transmits a hardware reset signal RESET n of the memory device 200, a pair of lines that transmits differential input signal pairs DIN_T and DIN_C, and a pair of lines that transmits differential output signal pairs DOUT_T and DOUT_C.

A frequency value of the reference clock provided from the host device 100 to the memory device 200 may be, but is not necessarily limited to, one of four values of 19.2 MHz, 26 MHz, 38.4 MHz and 52 MHz. The host device 100 may change the frequency value of the reference clock even during operation, that is, even during data transmission and reception between the host device 100 and the memory device 200.

The memory device 200 may generate clocks of various frequencies from the reference clock provided from the host device 100, by utilizing a phase-locked loop (PLL) or the like. Further, the host device 100 may set a data rate value between the host device 100 and the memory device 200 through the frequency value of the reference clock. That is, the value of the data rate may be determined based on the frequency value of the reference clock.

The UFS interface 300 may support a plurality of lanes, and each lane may be implemented as a differential pair. For example, the UFS interface 300 may include one or more receive lanes and one or more transmit lanes. In FIG. 1, a pair of lines that transmits the differential input signal pairs DIN_T and DIN_C may constitute a receive lane, and a pair of lines that transmits the differential output signal pairs DOUT_T and DOUT_C may constitute a transmit lane, respectively. In FIG. 1, although one transmit lane and one receive lane are shown, the number of transmit lanes and receive lanes may vary in accordance with different embodiments of the inventive concept.

The receive lane and the transmit lane may transmit the data in a serial communication manner, and a full-duplex type communication between the host device 100 and the memory device 200 is enabled by a structure in which the receive lane and the transmit lane are separated. That is, the memory device 200 may be configured to transmit data to the host device 100 through the transmit lane, even while receiving the data from the host device 100 through the receive lane. Also, control data, such as command from the host device 100 to the memory device 200, and user data to be stored in the non-volatile storage 220 of the memory device 200 or to be read from the non-volatile storage 220 by the host device 100 may be transmitted through the same lane. Accordingly, it may not be necessary to further provide a separate lane for data transmission, in addition to the pair of transmit lanes and the pair of receive lanes, between the host device 100 and the memory device 200.

Referring to FIG. 2, the UIC layer 250 may include an equalizer 251 including an analog front end (AFE), a CDR block 253, a decoder 256, a descrambler 257, a symbol remover 258, a lane merger 259, and a symbol translator 259a.

The equalizer 251 is configured to receive differential input signal pairs DIN_T and DIN_C from the host device (100 of FIG. 1), and may perform equalizing to output serial bit SB. In some embodiments, the host device (100 of FIG. 1) provides differential input signal pairs DIN_T and DIN_C, which are serial signals to the equalizer 251, and the equalizer 251 may output the serial bit SB from it.

The CDR block 253 may be configured to perform clock data recovery (CDR) and data deserialize to output an N-bit (N is a natural number) signal. The CDR block 253 may include an EOM block 255 that is configured to perform the EOM operation to measure the signal quality of the communication channel with the host device (100 of FIG. 1).

In some embodiments, although the EOM operation performed in the CDR block 253 may be performed using, for example, an SFR (Special Function Register) 252, the embodiments are not limited thereto.

Referring to FIGS. 2 and 3, the EOM operation performed in the CDR block 253 may be performed by measuring the quality of the signal received from the host device 100, using the SFR 252 under specific offset conditions.

Specifically, the EOM operation may be performed by comparing a main path signal MS of a main path indicated by a solid line in FIG. 3 with an EOM path signal ES of an EOM path indicated by a dotted line in FIG. 3.

The main path may be configured to recover the clock from a serial bit SB received from the host device 100 and passing through the equalizer 251, using a clock recovery circuit 253b, to extract data of the serial bit SB using the recovered clock RCK, and then to generate a main path signal MS through the deserializer 253a. The main path signal MS thus generated may be sent to the comparator 255b.

The EOM path may be configured to generate a clock dxRCK, which reflects a specific offset value dX on the clock RCK recovered from the serial bit SB received from the host device 100 and passing through the equalizer 251, to extract data of the serial bit SB by reflecting the clock dxRCK and the specific offset value dY, and then to generate an EOM path signal ES through the deserializer 255a. The EOM path signal ES thus generated may be sent to the comparator 255b.

For example, the main path signal MS may be data extracted from the reference conditions XR and YR of FIG. 4, and the EOM path signal ES may be data extracted from the offset conditions dX and dY of FIG. 4.

When the EOM path signal ES is recognized as the same signal as the main path signal MS, the comparator 255b may be configured to not output the error count signal EC. When the EOM path signal ES is not recognized as the same signal as the main path signal MS, the comparator 255b may output the error count signal EC. That is, the error counting may be performed by the error count signal EC that is output from the comparator 255b.

Further, the comparator 255b may be configured to output a sampling count signal SC each time such sampling (for example, comparison of the EOM path signal ES and the main path signal MS) is performed once.

In some embodiments, an offset value dX may include a time offset value, a phase offset value, and the like, and an offset value dY may include a voltage offset, or the like. However, the embodiments are not limited thereto.

In some embodiments, although the offset dX, the offset dY, the error count value according to the error count signal EC, the sampling number information according to the sampling count signal SC, and the like may be stored in the SFR 252, the embodiments are not limited thereto.

Referring again to FIG. 2, the decoder 256 may decode the N-bit signal, which is output from the CDR block 253 to an M-bit (M is a natural number greater than N) signal and a distinction signal DS. In some embodiments, although the N-bit signal may be a 10-bit signal and the M-bit signal may be an 8-bit signal, the embodiments are not limited thereto.

When the input N-bit signal is a data symbol, the decoder 256 may output the data signal D as the distinction signal DS. When the input N-bit signal is a control symbol, the decoder 256 may output the control signal K as the distinction signal DS.

The descrambler 257 may be configured to perform descrambling on the input M-bit signal and output the resulting signal. The symbol remover 258 may be configured to remove a skip symbol, such as a marker and a filler symbol, from the input M-bit signal. The lane merger 259 may be configured to merge the signals input to each lane and provide them to the symbol translator 259a. The symbol translator 259a may be configured to translate and output the symbols.

Referring again to FIG. 1, the UFS device controller 210 of the memory device 200 may be configured to generally control the operation of the memory device 200.

The UFS device controller 210 may be configured to manage the non-volatile storage 220 through a LU (logical unit) 211, which may be a logical storage unit of data. Although the number of LUs 211 may be, for example, eight, the embodiments are not limited thereto.

The UFS device controller 210 may include a flash translation layer (FTL), and may convert a logical data address sent from the host device 100, for example, an LBA (logical block address), into a physical data address, for example, a PBA (physical block address) or a PPN (physical page number), using the address mapping information of the FTL. In the UFS system 1, the logical block for storing user data may have a size of a predetermined range. For example, the minimum size of the logical block may be set to 4 Kbyte.

When a command from the host device 100 is input to the memory device 200 through the UIC layer 250, the UFS device controller 210 may be configured to perform an operation according to the input command, and may be configured to transmit the completion response to the host device 100 when the operation is completed.

For example, when the host device 100 tries to store user data in the memory device 200, the host device 100 may be configured to transmit a data write command to the memory device 200. When a response, which is ready to receive the user data (ready-to-transfer), is received from the memory device 200, the host device 100 may be configured to transmit the user data to the memory device 200. The UFS device controller 210 may be configured to temporarily store the transmitted user data in the device memory 240, and may store the user data temporarily stored in the device memory 240 at a selected position of the non-volatile storage 220 on the basis of the address mapping information of the FTL.

As still another example, when the host device 100 tries to read user data stored in the memory device 200, the host device 100 may be configured to transmit the data read command to the memory device 200. When receiving the command, the UFS device controller 210 may be configured to read the user data from the non-volatile storage 220 on the basis of the data read command, and may be configured to temporarily store the read user data in the device memory 240. In such a read procedure, the UFS device controller 210 may be configured to detect and correct errors of the read user data, using a built-in ECC (error correction code) circuit (not shown). Further, the UFS device controller 210 may be configured to transmit the user data temporarily stored in the device memory 240 to the host device 100.

Furthermore, the UFS device controller 210 may further include an AES (advanced encryption standard) circuit (not shown), and the AES circuit may be configured to encrypt or decrypt data, which is input to the UFS device controller 210, using a symmetric-key algorithm.

The host device 100 may be configured to store the commands to be transmitted to the memory device 200 in order in the UFS host register 111, which may function as a command queue, and to transmit the commands to the memory device 200 in that order. At this time, the host device 100 may be configured to transmit the next command waiting in the command queue to the memory device 200, even when the previously transmitted command is still being processed by the memory device 200, that is, even before receiving the notification that the previously transmitted command is completely processed by the memory device 200. Accordingly, the memory device 200 may also be configured to receive the next command from the host device 100, even while processing the previously transmitted command. The maximum number of commands (queue depth) that may be stored in such a command queue may be, for example, thirty two. In addition, the command queue may be implemented as a circular queue type that indicates a start and an end of a command row stored in the queue through a head pointer and a tail pointer.

Each of the plurality of storage units 221 may include a memory cell array (not shown), and a control circuit (not shown) that is configured to control the operation of the memory cell array. The memory cell array may include a two-dimensional memory cell array or a three-dimensional memory cell array. The memory cell array may include a plurality of memory cells, and each memory cell may be a cell (single level cell, SLC) that stores 1-bit information, but each memory cell may also be a cell that stores 2-bits or more information, such as a MLC (multi level cell), a TLC (triple level cell), and a QLC (quadruple level cell). A three-dimensional memory cell array may include a vertical NAND string, which is vertically oriented so that at least one memory cell is located above another memory cell in a cross-sectional view of the memory cell array. More specific description thereof will be provided below.

Various power supply voltages VCC, VCCQ1, VCCQ2, and the like may be input to the memory device 200. A VCC is a main power supply voltage for the memory device 200, and may have, for example, a value of about 2.4 to 3.6V. A VCCQ1 is a power supply voltage for supplying voltage of a low range, which is mainly for the UFS device controller 210, and may include, for example, a value of about 1.14V to 1.26V. VCCQ2 is a power supply voltage for supplying a voltage of a range lower than the VCC power supply voltage, but higher than the VCCQ1 power supply voltage, and is mainly for input-output interfaces, such as MIPI M-PHY 251, and may include, for example, a value of about 1.7V to 1.95V. The power supply voltages may be supplied for each component of the memory device 200 via the regulator 260. The regulator 260 may be implemented as a set of unit regulators, each connected to different ones among the aforementioned power supply voltages.

Figure 5:
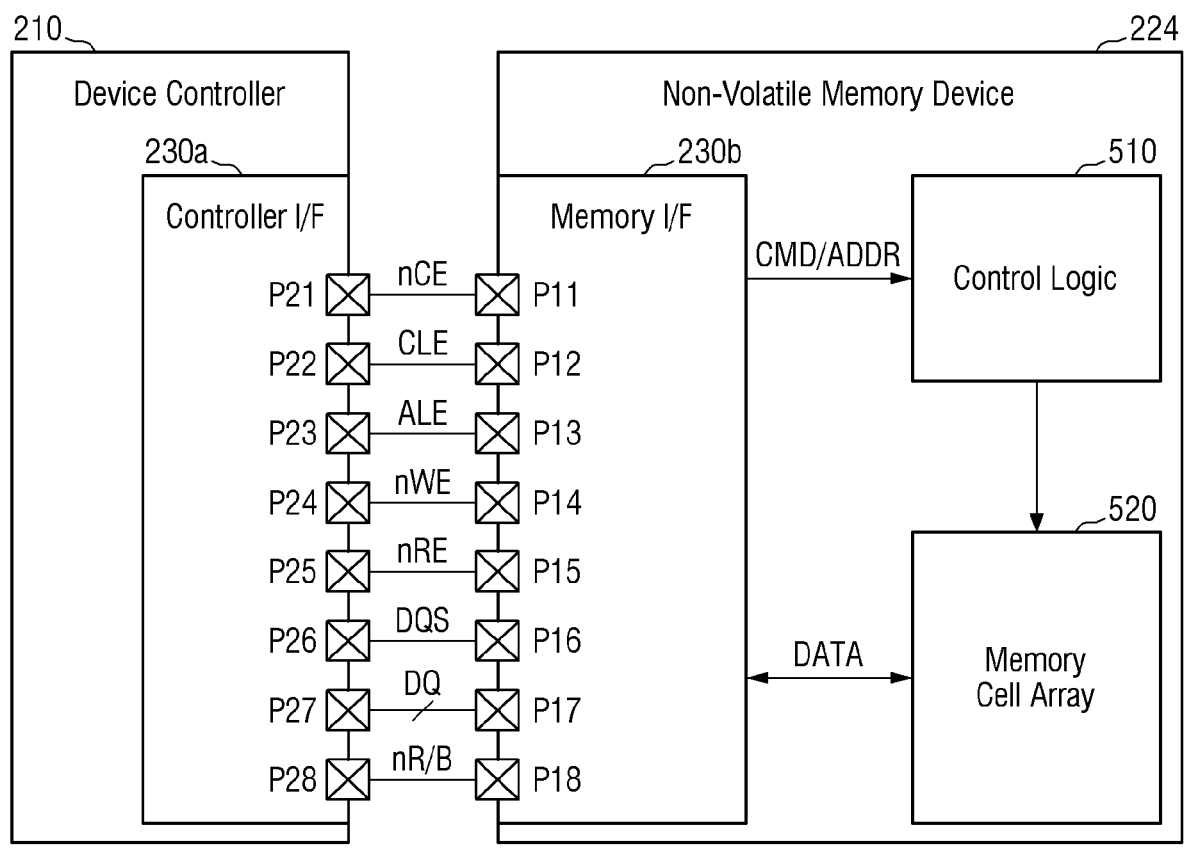
FIG. 5 is diagram in which a UFS device controller, a storage interface, and a non-volatile storage of FIG. 1 are reconfigured according to some embodiments of the inventive concept.

FIG. 5 is a diagram in which the UFS device controller, the storage interface, and the non-volatile storage of FIG. 1 are reconfigured according to some embodiments of the inventive concept.

The storage interface 230 of FIG. 1 may include a controller interface circuit 230a and the memory interface circuit 230b of FIG. 5. In some embodiments, the storage device 224 shown in FIG. 5 may correspond to the single storage unit 221 of FIG. 1. Also, in some embodiments, the storage device 224 may correspond to the non-volatile storage 220 of FIG. 1.

The storage device 224 may include first to eighth pins P11 to P18, a memory interface circuit 230b, a control logic circuit 510, and a memory cell array 520.

The memory interface circuit 230b may be configured to receive a chip enable signal nCE from the device controller 210 through the first pin P11. The memory interface circuit 230b may be configured to transmit and receive signals to and from the device controller 210 through second to eighth pins P12 to P18 in accordance with the chip enable signal nCE. For example, when the chip enable signal nCE is in an enable status (e.g., a low level), the memory interface circuit 230*b* may be configured to transmit and receive signals to and from the device controller 210 through second to eighth pins P12 to P18.

The memory interface circuit 230*b* may be configured to receive a command latch enable signal CLE, an address latch enable signal ALE, and a write enable signal nWE from the device controller 210 through second to fourth pins P12 to P14. The memory interface circuit 230*b* may be configured to receive the data signal DQ from the device controller 210 or transmit the data signal DQ to the device controller 210 through the seventh pin P17. The command CMD, the address ADDR, and the data DATA may be sent through the data signal DQ. For example, the data signal DQ may be sent through a plurality of data signal lines. In this case, the seventh pin P17 may include a plurality of pins corresponding to the plurality of data signals.

The memory interface circuit 230*b* may be configured to acquire the command CMD from the data signal DQ received in an enable section (e.g., a high level status) of the command latch enable signal CLE on the basis of toggle timings of the write enable signal nWE. The memory interface circuit 230*b* may be configured to acquire the address ADDR from the data signal DQ received in the enable section (e.g., the high level status) of the address latch enable signal ALE on the basis of the toggle timings of the write enable signal nWE.

In some embodiments, the write enable signal nWE holds a static status (e.g., a high level or a low level) and then may be toggled between the high level and the low level. For example, the write enable signal nWE may be toggled at the section in which the command CMD or the address ADDR is transmitted. Accordingly, the memory interface circuit 230*b* may be configured to acquire the command CMD or the address ADDR on the basis of the toggle timings of the write enable signal nWE.

The memory interface circuit 230*b* may be configured to receive a read enable signal nRE from the device controller 200 through the fifth pin P15. The memory interface circuit 230*b* may be configured to receive a data strobe signal DQS from the device controller 200 through a sixth pin P16, or may be configured to transmit the data strobe signal DQS to the device controller 200.

In a data DATA output operation of the storage device 224, the memory interface circuit 230*b* may be configured to receive the toggling read enable signal nRE through the fifth pin P15 before outputting the data DATA. The memory interface circuit 230*b* may be configured to generate the toggling data strobe signal DQS on the basis of the toggling of the read enable signal nRE. For example, the memory interface circuit 230*b* may be configured to generate the data strobe signal DQS that starts to toggle after a predetermined delay (e.g., tDQSRE) based on the toggling start time of the read enable signal nRE. The memory interface circuit 230*b* may be configured to transmit the data signal DQ including the data DATA based on the toggle timing of the data strobe signal DQS. Accordingly, the data DATA may be arranged using the toggle timing of the data strobe signal DQS and transmitted to the device controller 210.

In a data DATA input operation of the storage device 224, when the data signal DQ including the data DATA is received from the device controller 210, the memory interface circuit 230*b* may be configured to receive the toggling data strobe signal DQS together with the data DATA from the device controller 210. The memory interface circuit 230*b* may be configured to acquire the data DATA from the data signal DQ based on the toggle timing of the data strobe signal DQS. For example, the memory interface circuit 230*b* may be configured to acquire the data DATA by sampling the data signal DQ at a rising edge and a falling edge of the data strobe signal DQS.

The memory interface circuit 230*b* may be configured to transmit a ready/busy output signal nR/B to the device controller 210 through an eighth pin P18. The memory interface circuit 230*b* may be configured to transmit the status information of the storage device 224 to the device controller 210 through the ready/busy output signal nR/B. When the storage device 224 is in a busy status (that is, when the internal operations of the storage device 224 are being performed), the memory interface circuit 230*b* may be configured to transmit the ready/busy output signal nR/B indicating the busy status to the device controller 210. When the storage device 224 is in a ready status (i.e., the internal operations of the storage device 224 are not performed or are completed), the memory interface circuit 230*b* may be configured to transmit the ready/busy output signal nR/B indicating the ready status to the device controller 210. For example, while the storage device 224 reads the data DATA from the memory cell array 520 in response to a page read command, the memory interface circuit 230*b* may be configured to transmit the ready/busy output signal nR/B indicating the busy status (e.g., a low level) to the device controller 210. For example, while the storage device 224 programs the data DATA to the memory cell array 520 in response to the program command, the memory interface circuit 230*b* may be configured to transmit the ready/busy output signal nR/B indicating the busy status to the device controller 210.

The control logic circuit 510 may be configured to generally control various operations of the storage device 224. The control logic circuit 510 may be configured to receive the command/address CMD/ADDR acquired from the memory interface circuit 230*b*. The control logic circuit 510 may be configured to generate control signals for controlling other components of the storage device 224 in accordance with the received command/address CMD/ADDR. For example, the control logic circuit 510 may be configured to generate various control signals for programing the data DATA in the memory cell array 520 or reading the data DATA from the memory cell array 520.

The memory cell array 520 may be configured to store the data DATA acquired from the memory interface circuit 230*b* under the control of the control logic circuit 510. The memory cell array 520 may be configured to output the stored data DATA to the memory interface circuit 230*b* under the control of the control logic circuit 510.

The memory cell array 520 may include a plurality of memory cells. For example, the plurality of memory cells may be flash memory cells. However, embodiments of the present invention are not limited thereto, and the memory cells may be RRAM (Resistive Random Access Memory) cells, FRAM (Ferroelectric Random Access Memory) cells, PRAM (Phase Change Random Access Memory) cells, TRAM (Thyristor Random Access Memory) cells, and/or MRAM (Magnetic Random Access Memory) cells. Hereinafter, embodiments of the present invention will be described mainly based on an embodiment in which the memory cells are NAND flash memory cells.

The device controller 210 may include first to eighth pins P21 to P28, and a controller interface circuit 230*a*. The first to eighth pins P21 to P28 may correspond to the first to eighth pins P11 to P18 of the storage device 224.

The controller interface circuit 230*a* may be configured to transmit the chip enable signal nCE to the storage device 224 through a first pin P21. The controller interface circuit 230*a* may be configured to transmit and receive signals to and from the storage device 224 selected through the chip enable signal nCE through the second to eighth pins P22 to P28.

The controller interface circuit 230a may be configured to transmit the command latch enable signal CLE, the address latch enable signal ALE, and the write enable signal nWE to the storage device 224 through the second to fourth pins P22 to P24. The controller interface circuit 230a may be configured to transmit the data signal DQ to the storage device 224 or receive the data signal DQ from the storage device 224 through a seventh pin P27.

The controller interface circuit 230a may be configured to transmit the data signal DQ including the command CMD or the address ADDR to the storage device 224 along with a toggling write enable signal nWE. The controller interface circuit 230a may be configured to transmit the data signal DQ including the command CMD to the storage device 224 with transmission of the command latch enable signal CLE having the enable status, and may be configured to transmit the data signal DQ including the address ADDR to the storage device 224 with transmission of the address latch enable signal ALE having the enable status.

The controller interface circuit 230a may be configured to transmit the read enable signal nRE to the storage device 224 through a fifth pin P25. The controller interface circuit 230a may be configured to receive the data strobe signal DQS from the storage device 224 through a sixth pin P26, or may be configured to transmit the data strobe signal DQS to the storage device 224.

In the data DATA output operation of the storage device 224, the controller interface circuit 230a may be configured to generate a toggling read enable signal nRE, and may be configured to transmit the read enable signal nRE to the storage device 224. For example, the controller interface circuit 230a may be configured to generate the read enable signal nRE that changes from the static status (e.g., a high level or a low level) to the toggle status before the data DATA is output. Accordingly, the toggling data strobe signal DQS may be generated in the storage device 224 based on the read enable signal nRE. The controller interface circuit 230a may be configured to receive the data signal DQ including the data DATA along with the toggling data strobe signal DQS from the storage device 224. The controller interface circuit 230a may be configured to acquire the data DATA from the data signal DQ based on the toggle timing of the data strobe signal DQS.

In the data DATA input operation of the storage device 224, the controller interface circuit 230a may be configured to generate the toggling data strobe signal DQS. For example, the controller interface circuit 230a may be configured to generate the data strobe signal DQS that changes from the static status (e.g., a high level or a low level) to the toggle status before transmitting the data DATA. The controller interface circuit 230a may be configured to transmit the data signal DQ including the data DATA to the storage device 224 based on the toggle timings of the data strobe signal DQS.

The controller interface circuit 230a may be configured to receive a ready/busy output signal nR/B from the storage device 224 through an eighth pin P28. The controller interface circuit 230a may be configured to discriminate the status information of the storage device 224 based on the ready/busy output signal nR/B.

Figure 6:
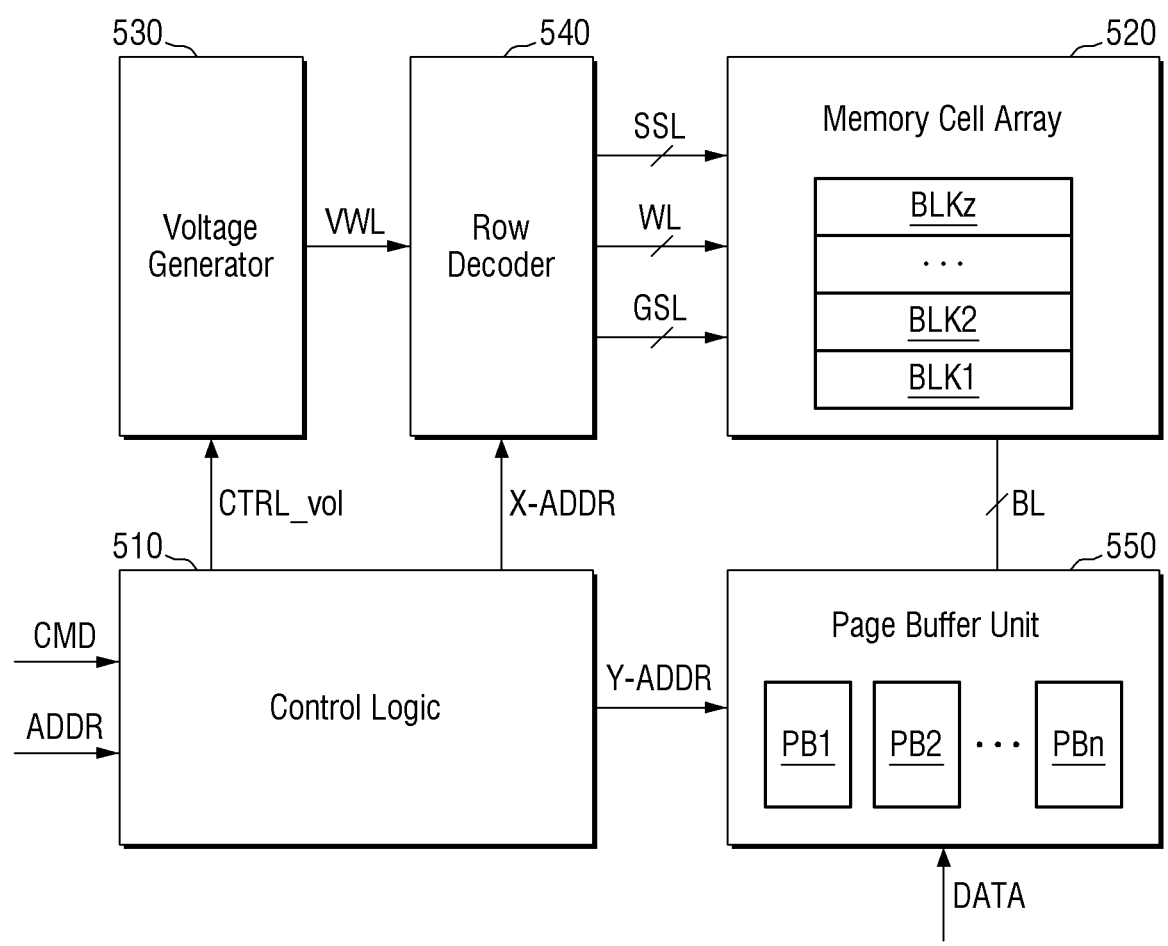
FIG. 6 is an example block diagram illustrating the storage device of FIG. 6 according to some embodiments of the inventive concept.

FIG. 6 is an example block diagram illustrating the storage device of FIG. 5 according to some embodiments of the inventive concept.

Referring to FIG. 6, the storage device 224 may include a control logic circuit 510, a memory cell array 520, a page buffer unit 550, a voltage generator 530, and a row decoder 540. Although not shown in FIG. 6, the storage device 224 may further include the memory interface circuit 230b shown in FIG. 5, and may further include a column logic, a pre-decoder, a temperature sensor, a command decoder, an address decoder, and the like.

The control logic circuit 510 may be configured to generally control various operations inside the storage device 224. The control logic circuit 510 may be configured to output various control signals in response to the command CMD and/or the address ADDR from the memory interface circuit 230b. For example, the control logic circuit 510 may output a voltage control signal CTRL_vol, a row address X-ADDR, and a column address Y-ADDR.

The memory cell array 520 may include a plurality of memory blocks BLK1 to BLKz (z is a positive integer), and each of the plurality of memory blocks BLK1 to BLKz may include a plurality of memory cells. The memory cell array 520 may be connected to the page buffer unit 550 through the bit lines BL, and may be connected to the row decoder 540 through word lines WL, string selection lines SSL, and ground selection lines GSL.

In an example embodiment, the memory cell array 520 may include a three-dimensional memory cell array, and the three-dimensional memory cell array may include a plurality of NAND strings. Each NAND string may include memory cells connected to word lines stacked vertically on the substrate. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 520 may include a two-dimensional memory cell array, and the two-dimensional memory cell array may include a plurality of NAND strings placed along row and column directions.

The page buffer unit 550 may include a plurality of page buffers PB1 to PBn (n is an integer of three or more), and each of the plurality of page buffers PB1 to PBn may be connected to the memory cells through a plurality of bit lines BL. The page buffer unit 550 may be configured to select at least one bit line among the bit lines BL in response to the column address Y-ADDR. The page buffer unit 550 may be configured to operate as an entry driver or a detection amplifier, depending on the operating mode. For example, at the time of the program operation, the page buffer unit 550 may be configured to apply a bit line voltage corresponding to the data to be programmed to the selected bit line. At the time of the read operation, the page buffer unit 550 may be configured to detect the current or voltage of the selected bit line and to detect the data stored in the memory cell.

The voltage generator 530 may be configured to generate various types of voltages for performing program, read, and erasure operations based on the voltage control signal CTRL_vol. For example, the voltage generator 530 may generate a program voltage, a read voltage, a program verification voltage, an erasure voltage, and the like, as a word line voltage VWL.

The row decoder 540 may select one of a plurality of word lines WL, and select one of a plurality of string selection lines SSL in response to the row address X-ADDR. For example, the row decoder 540 may be configured to apply a program voltage and a program verification voltage to the selected word line at the time of the program operation, and may be configured to apply a read voltage to the selected word line at the time of the read operation.

Figure 7:
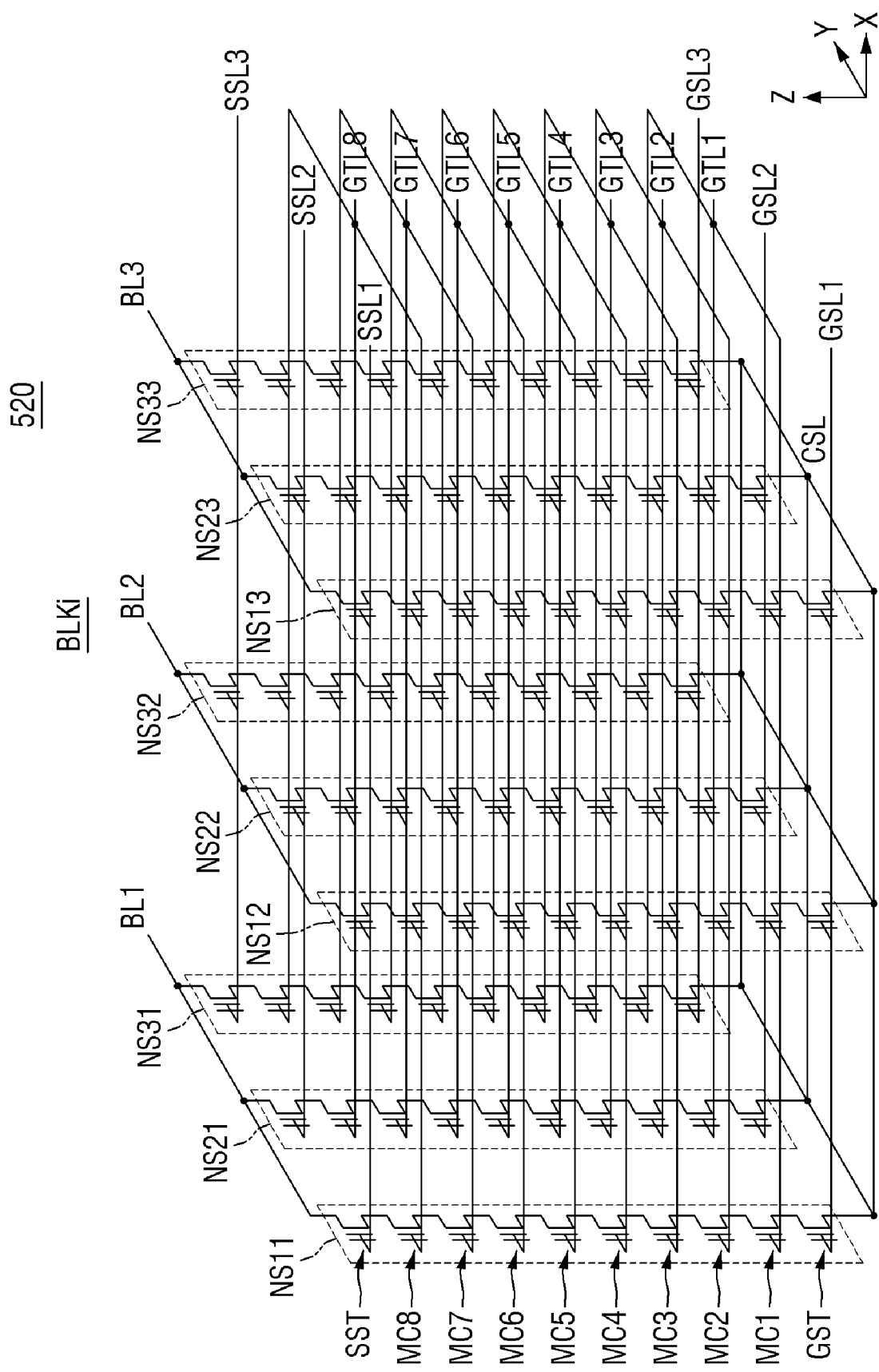
FIG. 7 is a diagram that illustrates a 3D V-NAND structure according to some embodiments of the inventive concept.

FIG. 7 is a diagram illustrating a 3D V-NAND structure according to some embodiments of the inventive concept.

When the storage module of the storage device is implemented as a 3D V-NAND type flash memory, each of the plurality of memory blocks constituting the storage module may be represented by an equivalent circuit as shown in FIG. 7.

A memory block BLKi shown in FIG. 7 shows a three-dimensional memory block formed in a three-dimensional structure on the substrate. For example, a plurality of memory NAND strings included in the memory block BLKi may be formed in a direction perpendicular to the substrate.

Referring to FIG. 7, the memory block BLKi may include a plurality of memory NAND strings NS11 to NS33 connected between the bit lines BL1, BL2, and BL3 and the common source line CSL. A plurality of memory NAND strings NS11 to NS33 may each include a string selection transistor SST, a plurality of memory cells MC1, MC2, . . . , MC8, and a ground selection transistor GST. Although FIG. 6 shows that each of the plurality of memory NAND strings NS11 to NS33 includes eight memory cells MC1, MC2, . . . , MC8, the embodiments are not necessarily limited thereto.

The string selection transistor SST may be connected to the corresponding string selection lines SSL1, SSL2, and SSL3. The plurality of memory cells MC1, MC2, . . . , MC8 may each be connected to the corresponding gate lines GTL1, GTL2, . . . , and GTL8. The gate lines GTL1, GTL2, GTL8 may correspond to word lines, and at least some of the gate lines GTL1, GTL2, GTL8 may correspond to dummy word lines. The ground selection transistor GST may be connected to the corresponding ground selection lines GSL1, GSL2, and GSL3. The string selection transistor SST may be connected to the corresponding bit lines BL1, BL2, and BL3, and the ground selection transistor GST may be connected to the common source line CSL.

The word lines (e.g., WL1) of the same height are connected in common, and the ground selection lines GSL1, GSL2, and GSL3 and the string selection lines SSL1, SSL2, and SSL3 may be separated from each other. Although FIG. 7 shows that the memory block BLK is connected to eight gate lines GTL1, GTL2, . . . , and GTL8 and three bit lines BL1, BL2, and BL3, the embodiments are not necessarily limited thereto.

FIG. 8 is a flowchart that illustrates operations of the memory system according to some embodiments of the inventive concept. FIGS. 9 to 14 are diagrams that illustrate operations of the memory system according to some embodiments of the inventive concept.

First, referring to FIG. 8, the host device 100 transmits a command for requesting the EOM (Eye Open Monitor) operation to the memory device 200 (S110).

In some embodiments, such a request command may be implemented in the form of WRITE BUFFER COMMAND shown in FIG. 9 which complies with the JEDEC UFS standard. FIG. 9 is a diagram showing a CDB (Command Descriptor Block) of a WRITE BUFFER COMMAND which complies with the JEDEC UFS standard, and FIG. 10 is a diagram showing a description of the mode (MODE) field setting values of the WRITE BUFFER COMMAND.

Specifically, referring to FIGS. 1, 9 and 10, the UFS host controller 110 of the host device 100 sets the mode (MODE) field of the WRITE BUFFER COMMAND to 1F, and may request the UFS device controller 210 of the memory device 200 to perform the EOM operation. Further, the UFS device controller 210 that receives the request may prepare for the EOM operation.

In some embodiments, the operations of the UFS host controller 110 and the operations of the UFS device controller 210 may be performed by controlling the UFS host controller 110 and the UFS device controller 210 using logic implemented through firmware. However, the embodiments are not limited thereto.

Referring to FIG. 10, FIG. 10 shows an example in which the EOM operation is requested when the setting value of the mode (MODE) field of WRITE BUFFER COMMAND is 0x1F. However, the embodiments are not limited to the shown example. If necessary, the setting value of the mode (MODE) field that requests the EOM operation may be modified into another setting value (for example, other setting values set as 'Reserved' in the standard specifications such as 0x1D and 0x1E).

In other embodiments, referring to FIGS. 1 and 9, the UFS host controller 110 may send the size of EOM data to the UFS device controller 210, using a parameter list length field of the WRITE BUFFER COMMAND.

Next, referring to FIG. 8, the memory device 200 transmits a response to the WRITE BUFFER COMMAND to the host device 100 (S120).

In some embodiments, such a response may include data capacity information, which is receivable by the memory device 200. That is, when the memory device 200 responds to the host device 100, for example, by k (k is a natural number) byte as a response, the host device 100 may transmit data to be transmitted to the memory device 200 later (for example, data necessary for performing the EOM operation) by dividing the data in units of k bytes.

Next, referring to FIG. 8, the host device 100 transmits the generated EOM data to the memory device 200, and the memory device 200 transmits the response to the EOM data reception to the host device 100 (S130, S140).

In some embodiments, the host device 100 may generate the EOM data used in the EOM operation that is performed in the memory device 200.

A generation time point of the EOM data may be before a time point (S110) when the host device 100 transmits a command for requesting the EOM operation to the memory device 200, and may be after a time point (S120) when the response to WRITE BUFFER COMMAND is transmitted from the memory device 200 to the host device 100.

Further, in some embodiments, the generation time point of the EOM data may be a time point between the time point (S110) when the host device 100 transmits the command for requesting the EOM operation to the memory device 200 and the time point (S120) when the response to WRITE BUFFER COMMAND is transmitted from the memory device 200 to the host device 100. That is, the timing when the host device 100 generates the EOM data used in the EOM operation that is performed in the memory device 200 may be modified in accordance with various embodiments of the inventive concept.

In some embodiments, the EOM data generated by the host device 100 may include parameters used in performing the EOM operation and pattern data used in performing the EOM operation.

In some embodiments, the parameters used in performing the EOM operation may include offset values dX and dY used in performing the EOM operation of the memory device 200 described above.

An offset value dX may include a time offset value, a phase offset value, and the like, and an offset value dY may include a voltage offset value, or the like. However, the embodiments are not limited thereto.

Further, the parameters used in performing the EOM operation may include phase resolution information. Such phase resolution information may be used for receiving the pattern data from the host device 100 by the memory device 200.

In some embodiments, the pattern data used in performing the EOM operation is a serial bit (SB of FIG. 3) provided from the host device 100 used to perform the EOM operation of the memory device 200 described above.

In some embodiments, the host device 100 may generate a plurality of pattern data, and such a plurality of pattern data are generated by combination of various bit sequences, and the EOM operation performance result may be generated using a consistent data pattern.

Although examples of the pattern data include PRBS (pseudorandom binary sequence) data, CRPAT (Compliant Random Test Pattern) data, CJTPAT (Compliant jitter tolerance pattern) data, and the like, the embodiments are not limited thereto.

FIG. 11 is a diagram illustrating a structure of EOM data transmitted to the memory device 200 by the host device 100 according to some embodiments of the inventive concept.

Referring to FIG. 11, the EOM data may include an EOM data header EDH and an EOM data pattern EDP.

The EOM data header EDH may include parameters used to perform the EOM operation. For example, the phase selection field (PHASE SELELCT) includes the time offset value or phase offset value to be sent to the memory device 200, and the reference voltage control field (VREF CONTROL) may include a voltage offset value to be sent to the memory device 200.

That is, the time offset value or the phase offset value used to perform the EOM operation described above referring to FIGS. 3 and 4 in the memory device 200 may be provided from the host device 100 to the memory device 200 through the phase selection field (PHASE SELELCT). Also, the voltage offset value used to perform the EOM operation described above referring to FIGS. 3 and 4 in the memory device 200 may be provided from the host device 100 to the memory device 200 through the reference voltage control field (VREF CONTROL).

In other embodiments, the phase resolution information (gear information) referred to by the memory device 200 for receiving the pattern data from the host device 100 may be provided from the host device 100 to the memory device 200 through the phase resolution field (PHASE RESOLUTION).

Further, the number of samplings performed by the memory device 200 while performing the EOM operation may be provided from the host device 100 to the memory device 200 through the sampling number field (NUMBER OF SAMPLING).

Further, the size of the pattern data to be received from the host device 100 by the memory device 200 may be provided from the host device 100 to the memory device 200 through the data length field (EOM DATA LENGTH).

Although FIG. 11 shows an example of an EOM data header EDH made up of 12 bytes, the embodiments are not limited thereto, and the size of the EOM data header EDH may vary in accordance with different embodiments of the inventive concept.

The EOM data pattern EDP may include pattern data used for performing the EOM operation. As shown in FIG. 11, the EOM data pattern EDP may include a plurality of pattern data. In some embodiments, N shown in FIG. 11 may be a natural number greater than 12.

Figure 12:
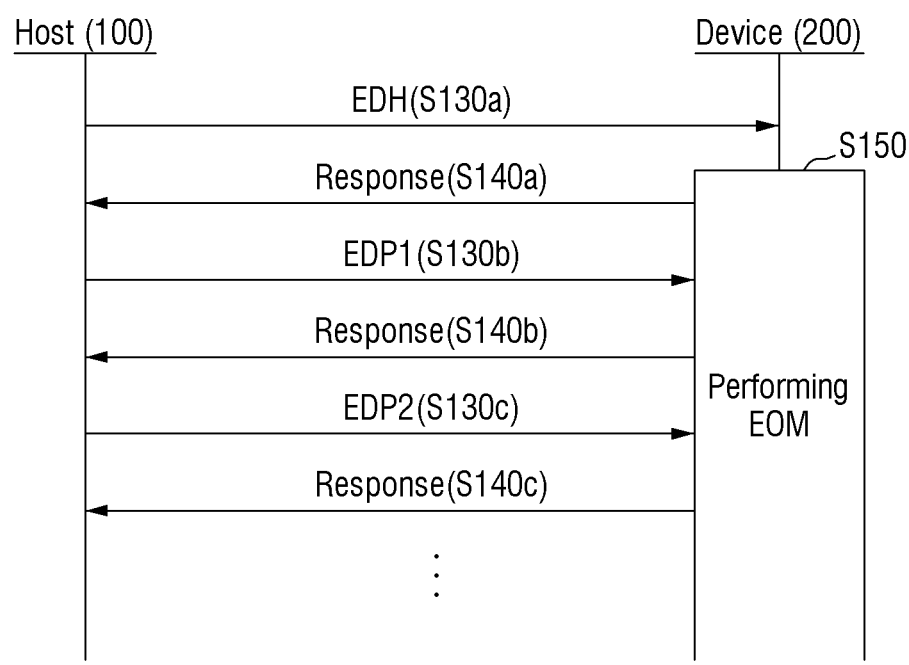

Referring to FIG. 12, the EOM data header EDH and the EOM data pattern EDP may be transmitted from the host device 100 to the memory device 200 several times. The receivable data capacity information by which the memory device 200 responds to the host device 100 in step S110 of FIG. 8 above may be considered in determining a method of transmitting the EOM data header EDH and the EOM data pattern EDP to the memory device 200 from the host device 100.

For example, in operation S110 of FIG. 8, if the receivable data capacity information by which the memory device 200 responds to the host device 100 is 12 bytes, the host device 100 may transmit the EOM data header EDH and the EOM data pattern EDP to the memory device 200 by the method as shown in FIG. 12.

Specifically, the host device 100 first transmits the EOM data header EDH having a 12-byte size to the memory device 200 (S130a). Further, the memory device 200 responds to the host device 100 that the EOM data header EDH is received (S140a).

Subsequently, the host device 100 transmits the 12-byte size EOM data pattern EDP among the EOM data pattern EDP to the memory device 200 (S130b). Further, the memory device 200 responds to the host device 100 that the EOM data pattern EDP is received (S140b). Further, the host device 100 transmits the subsequent 12-byte size EOM data pattern EDP among the EOM data pattern EDP to the memory device 200 (S130c). Further, the memory device 200 responds to the host device 100 that the EOM data pattern EDP is received (S140c). By repeating these operations in such a manner, all the EOM data patterns EDP shown in FIG. 12 may be provided from the host device 100 to the memory device 200.

In other embodiments, the structure of the EOM data to be transmitted to the memory device 200 by the host device 100 is not limited to the example shown in FIG. 11.

FIG. 13 is a diagram showing a structure of EOM data to be transmitted to the memory device 200 by the host device 100 according to some other embodiments of the inventive concept.

Referring to FIG. 13, the EOM data may include an EOM data header EDH and an EOM data pattern EDP.

The EOM data header EDH may include the parameters used to perform the EOM operation.

For example, a timing offset field and a timing step field may include a time offset value or a phase offset value to be sent to the memory device 200, and a voltage offset field and a voltage step field may include a voltage offset value to be sent to the memory device 200.

That is, the time offset value or phase offset value used to perform the EOM operation described above referring to FIGS. 3 and 4 in the memory device 200 may be provided from the host device 100 to the memory device 200 through the timing offset field and the timing step field. Further, the voltage offset values used to perform the EOM operation described above referring to FIGS. 3 and 4 in the memory device 200 may be provided from the host device 100 to the memory device 200 through the voltage offset field and the voltage step field.

That is, in this embodiment, the offset value dX and the offset value dY shown in FIGS. 3 and 4 are not provided through one value as in the embodiment shown in FIG. 11, but are expressed by two fields of the reference value (reference phase or reference voltage) and the offset value of the reference value (offset phase value or offset voltage value).

In other embodiments, the number of samplings performed by the memory device 200 while performing the EOM operation may be provided from the host device 100 to the memory device 200 through the sampling number field (Number of Sampling).

Further, the size of the pattern data to be received by the memory device 200 from the host device 100 may be provided from the host device 100 to the memory device 200 through the data length field (Total Data Length).

Referring again to FIG. 8, the memory device 200 provided with the EOM data performs the EOM operation (S150).

In some embodiments, the EOM operation may be performed during reception of the EOM data pattern (EDP of FIG. 11) after the EOM data header (EDH of FIG. 12) is received. However, the embodiments are not limited thereto, and the EOM operation may also be performed after all the EOM data patterns (EDP of FIG. 12) have been received.

Referring to FIGS. 1 to 4, each time one pattern data is received from the host device 100, the EOM block 255 may perform the operation described above referring to FIGS. 3 and 4. That is, the error count signal EC and the sampling count signal SC may be output for each of the received pattern data.

The sampling count signal SC may be used to determine whether the sampling number of the sampling number field (NUMBER OF SAMPLING) provided to the memory device 200 from the host device 100 is the same as the sampling number performed by the memory device 200.

The error count signal EC may be used to calculate the error count value corresponding to the phase offset value provided through the phase selection field (PHASE SELELCT) and the voltage offset value provided through the reference voltage control field (VREF CONTROL), for all pattern data received from the host device 100.

For example, if the host device 100 transmits one hundred pattern data to perform the EOM operation of the memory device 200, and the number of error count signals EC output from the EOM block 255 by receiving the one hundred pattern data is thirty, the error count value according to the EOM operation performance may be thirty. Such an error count value may be used to calculate an error rate (30% in this example).

Referring again to FIG. 8, after performing the EOM operation, the memory device 200 transmits a response signal including the performance result of the EOM operation to the host device 100 (S160).

The response signal may include the success or failure of the EOM operation performance, and the error count value corresponding to the phase offset value and the voltage offset value.

For example, if the sampling number of the sampling number field (NUMBER OF SAMPLING) provided from the host device 100 to the memory device 200 is the same as the number of sampling count signal SC output from the comparator 255b of the memory device 200, the memory device 200 may determine that the EOM operation performance is completed, and may transmit completion information to the host device 100.

In contrast, if the sampling number of the sampling number field (NUMBER OF SAMPLING) provided from the host device 100 to the memory device 200 is different from the number of the sampling count signal SC output from the comparator 255b of the memory device 200, the memory device 200 may determine that the EOM operation performance is not completed, and may transmit failure information to the host device 100.

In some embodiments, although the success or failure of the EOM operation performance may be provided to the host device 100, for example, through the response field (Response) shown in FIG. 14, the embodiments are not limited thereto.

Also, in some embodiments, although the error count values described above may be provided to, for example, the host device 100 through the four detect data fields (Detect Data[0], Detect Data[1], Detect Data[2], and Detect Data[3]) shown in FIG. 14, the embodiments are not limited thereto.

Also, in some embodiments, the response signal may include preset information. Such preset information may be referred to and used for changing the signal driving characteristics of the host device 100 or changing the signal receiving characteristics of the memory device 200.

In the memory system described above, another external device is not required to grasp the quality characteristics of the signals transmitted and received between the host device 100 and the memory device 200. Further, the signal line on which the EOM operation is performed is also the same as the signal line on which the host device 100 and the memory device 200 actually transmit and receive signals. This makes it possible to perform the EOM operation with relative ease, which has high reliability.

Figure 15:
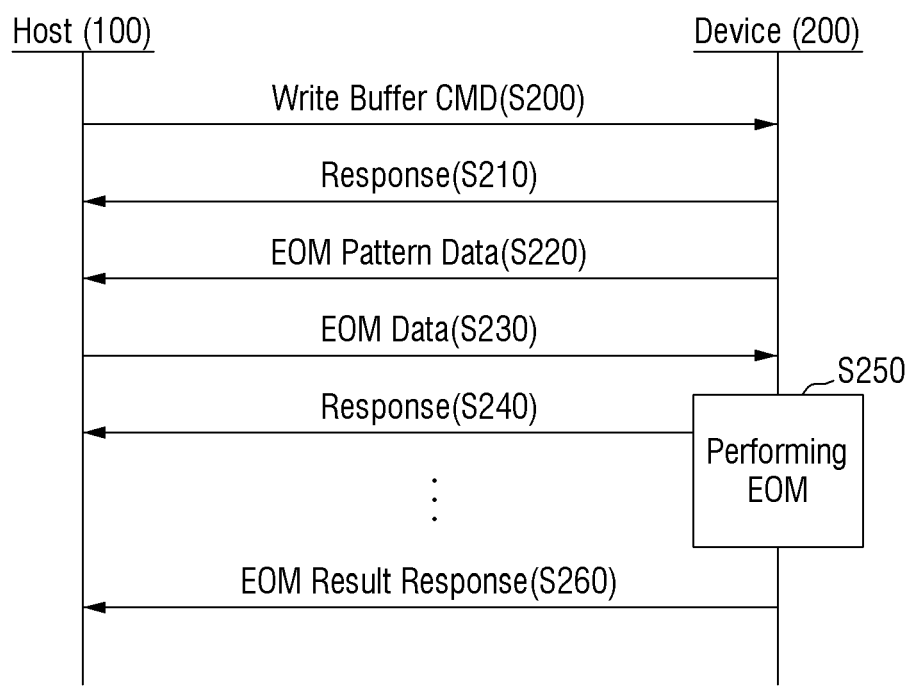
FIG. 15 is a flowchart that illustrate operations of the memory system according to some other embodiments of the inventive concept.

FIG. 15 is a flowchart that illustrates the operation of the memory system according to some other embodiments of the inventive concept.

Hereinafter, repeated explanation of the above-described embodiments will be omitted as much as possible, and differences will be mainly described.

Referring to FIG. 15, the host device 100 transmits a command for requesting the EOM operation performance to the memory device 200 (S200). Further, the memory device 200 transmits a response to the WRITE BUFFER COMMAND to the host device 100 (S210).

Subsequently, the memory device 200 transmits the pattern data used for performing the EOM operation to the host device 100 (S220).

Referring to FIG. 1, in some embodiments, although the pattern data necessary for performing the EOM operation is stored in the non-volatile memory 220 of the memory device 200, and then may be transmitted to the host device 100, the embodiments are not limited thereto.

That is, in these embodiments, unlike the embodiments described above referring to FIG. 8, the host device 100 does not generate the pattern data used for performing the EOM operation, but uses the pattern data stored in the memory device 200 for performing the EOM operation.

After that, the host device 100 transmits the EOM data including the parameters necessary for performing the EOM operation and the pattern data received from the memory device 200 to the memory device 200 (S230). Further, the memory device 200 transmits a response to the reception of the EOM data to the host device 100 (S240). The memory device 200 provided with the EOM data performs the EOM operation (S250), and the memory device 200 that performs the EOM operation transmits a response signal including the EOM operation performance result to the host device 100 (S260).

Figure 16:
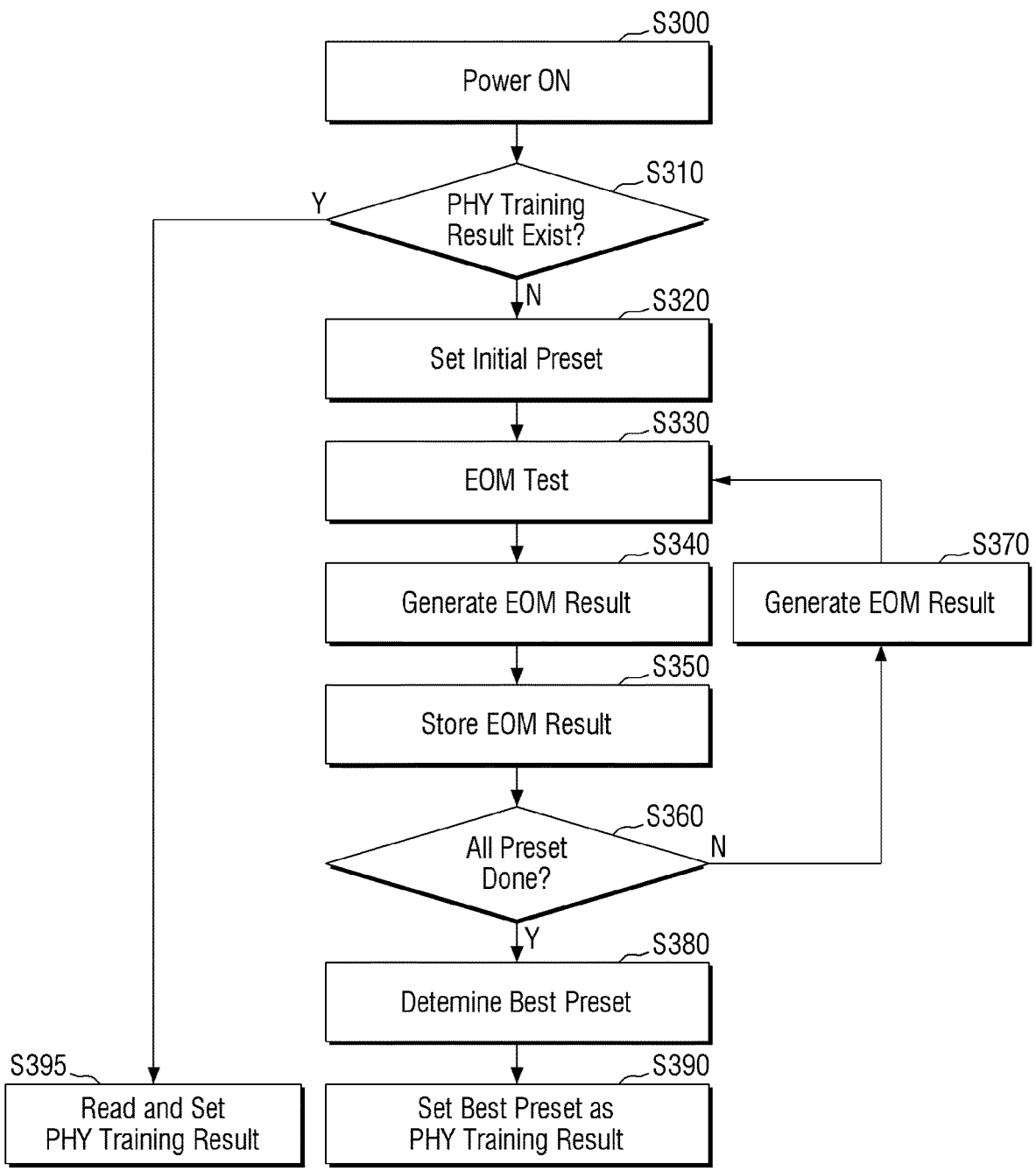
FIG. 16 is a flowchart that illustrate phy training operations according to some embodiments of the inventive concept.

FIG. 16 is a flowchart that illustrates a phy training operation according to some embodiments of the inventive concept. FIGS. 17 to 20 are diagrams that illustrates the phy training operation of FIG. 16.

In some embodiments, although the phy training operation shown in FIG. 16 may be performed at the phy level when the memory device is first booted up, the embodiments are not limited thereto.

Referring to FIGS. 1 and 16, the memory device 200 is powered on (S300). For example, when the memory device 100 is powered on, the host device 100 may detect the power-on.

Next, it is checked whether there a phy training result has been previously generated (S310). If there is a prior phy training result (S310—Y), the phy training result is read, and a preset is set (S395). In contrast, when there is no prior phy training result (S310—N), an initial preset is set (S320).

Here, the preset is a set value of the transmission parameter of the transmitter and the reception parameter of the receiver.

For example, a preset P00 shown in FIG. 17 may be set to an initial preset, and information of such a preset P00 may be shared by the host device 100 and the memory device 200.

Figure 18:
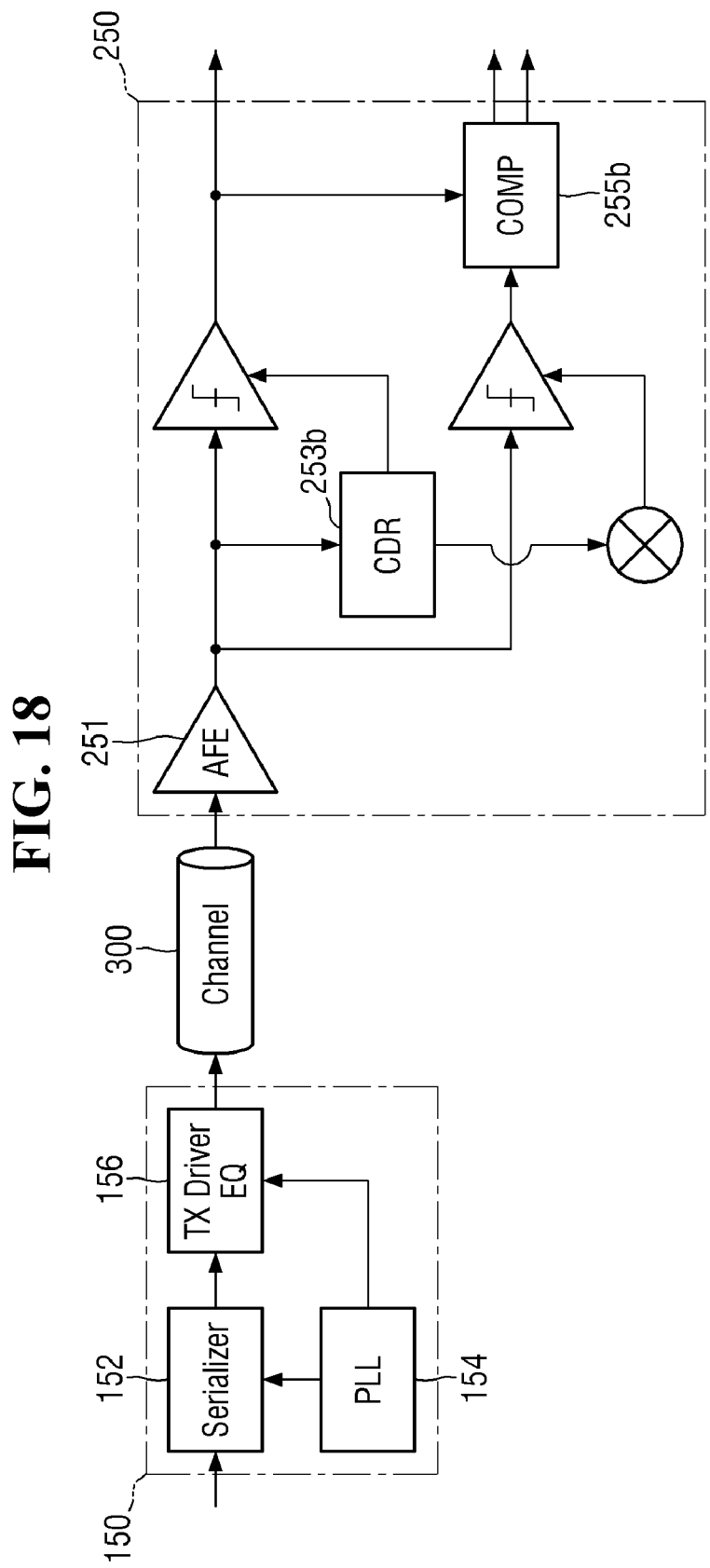

In some embodiments, the preset P00 may include setting values for setting a serializer 152, a PLL 154, and/or a transmission equalizer 156 included in the UIC layer 150 of the host device 100 shown in FIG. 18. Further, the preset P00 may include setting values for setting a reception equalizer 251 included in the UIC layer 250 of the memory device 200.

The example shown in FIG. 18 is an example of a case where the host device 100 transmits the data and the memory device 200 receives the data, and the embodiments are not limited thereto. In further embodiments, the memory device 200 transmits the data and the host device 100 receives the data.

Next, the EOM operation is performed using the set preset (e.g., P00) (S330).

For example, the host device 100 receives the preset P00 information from the memory device 200, sets the data transmission parameters according to the preset P00 information, and then requests the memory device 200 to perform the EOM operation. The memory device 200 may set the data reception parameter according to the preset P00 information, and then receive the data used for performing the EOM operation from the host device 100 to perform the EOM operation. Because specific description of such an operation has been sufficiently provided above, detailed description thereof will not be provided.

Next, the results according to the EOM operation performance is generated (S340).

Figure 19A:
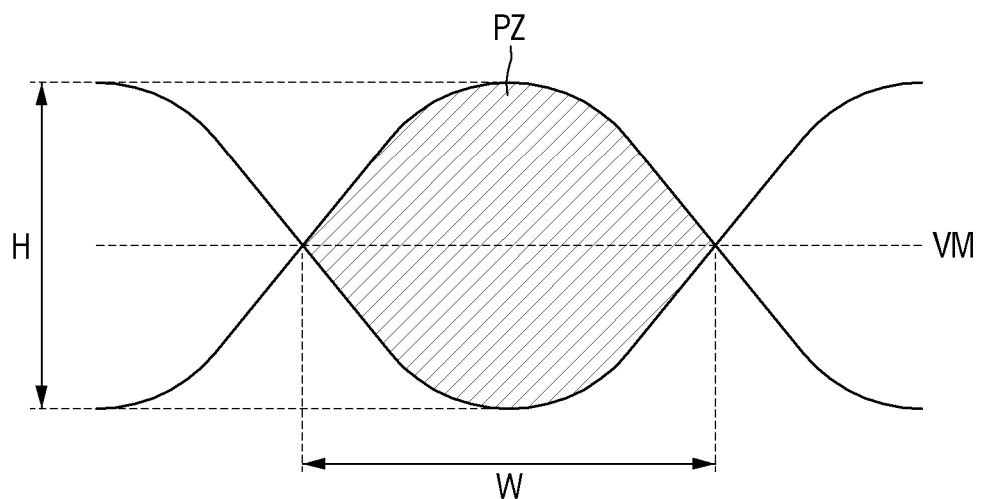

Referring to FIGS. 19a and 20, the results according to the EOM operation performance on the preset P00 may include, but are not limited to, a height H of a path zone PZ, a width W of a path zone PZ, the number of path grids of the path zone PZ, a vertical intermediate value VM of the path zone PZ, and the like.

A score of the preset P00 may be generated based on the height H of the path zone PZ, the width W of the path PZ, the number of path grids of the path zone PZ, the vertical intermediate value VM of the path zone PZ, and the like.

For example, the score may be calculated as shown in Table 1 below.

When score(s)=s1+s2+S3 (however, if the vertical intermediate value vm of the path zone does not correspond to −20≤vm≤20, the score(s)=0).

For example, as the EOM result of the preset P00, the width of the path zone PZ is 472, the height is 140, the vertical intermediate value is 0, and the number of path grids is 1892. Therefore, the score of the preset P00 is 0+140+189.2=392.2.

Figure 19B:
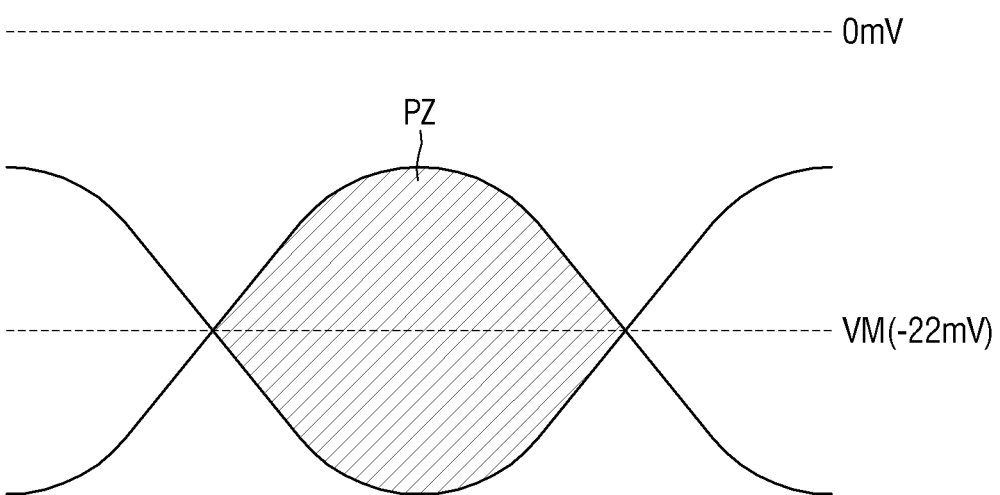

Incidentally, as the EOM result of the preset P35, the width of the path zone PZ is 550, the height is 177, the number of path grids is 2788, and as shown in FIG. 19b, the vertical intermediate value is −22 mv. Therefore, the score of the preset P35 is 0.

Next, referring to FIG. 16, the result according to the EOM operation performance is stored (S350), and it is determined whether the EOM operation performance is completed for all presets (S360). If the EOM operation performance is not completed for all presets (S360—N), the next preset (e.g., P01) is set (S370). The preset (e.g., P01) information that is newly set in this way is provided to the host device 100, and may be shared by the host device 100 and the memory device 200. Further, the EOM operation is performed by the set preset (e.g., P01) through the aforementioned method (S330).

If the EOM operation performance is completed for all presets (S360—Y), the preset having the highest score among the presets is determined (S380). Further, the preset having the highest score is set as the phy training result (S390). The preset having the highest score may be sent to the host device 100 and used to set the transmission parameters of the host device 100.

Figure 21:
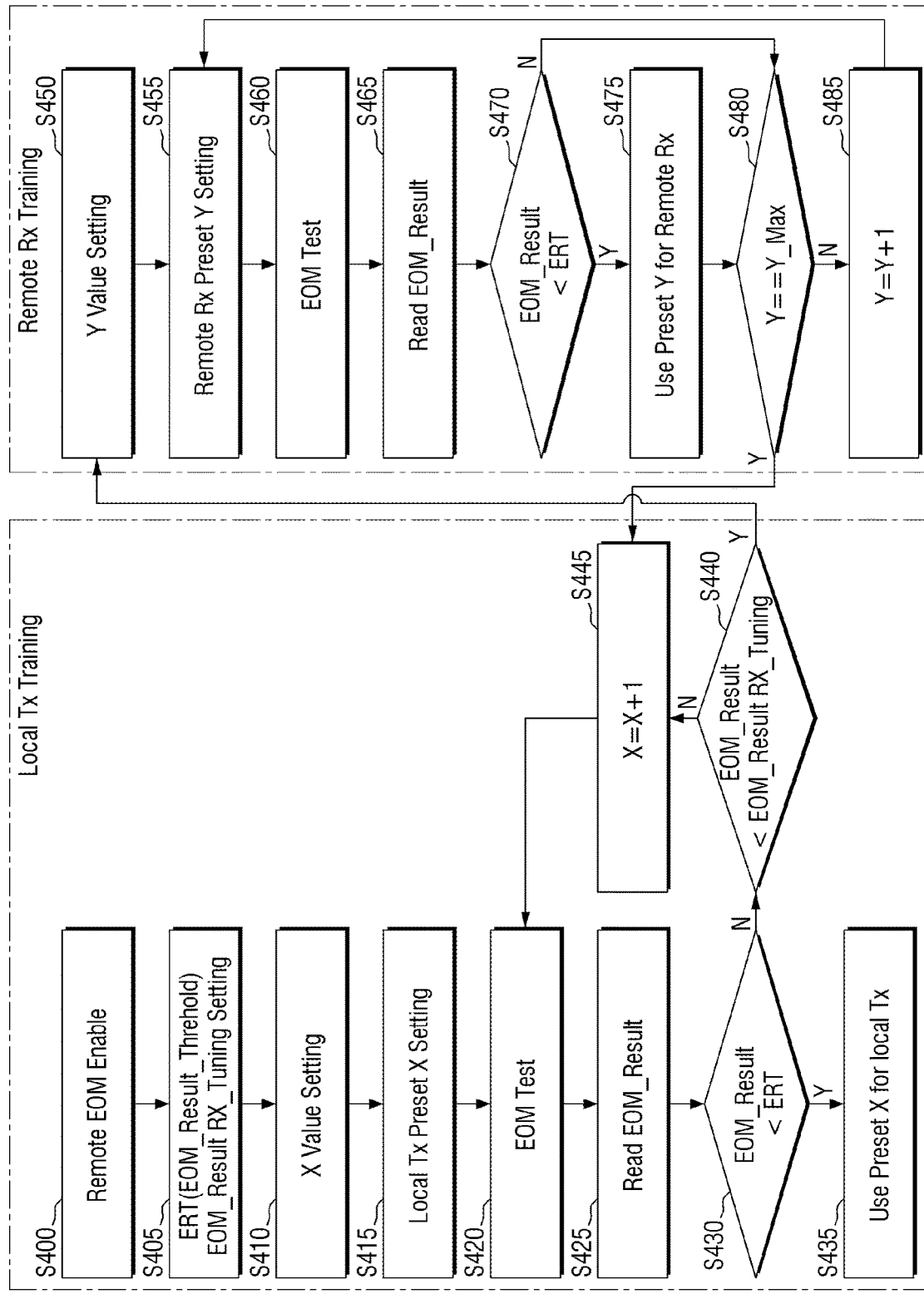
FIG. 21 is a flowchart that illustrates phy training operations according to some other embodiments of the inventive concept.

FIG. 21 is a flowchart that illustrates the phy training operation according to some other embodiments of the inventive concept.

In these embodiments, a method of preferentially changing the transmission parameters of the transmitter to search for the optimum or desired preset, and changing the reception parameters of the receiver when a threshold value may not be satisfied by the transmission parameter change of the transmitter will be described.

Referring to FIG. 21, the EOM operation is prepared (S400). For example, the host device 100 may cause the memory device 200 to prepare the EOM operation.

Next, an EOM threshold value and a receiver tuning threshold value are set (S405). Further, the transmission preset of the transmitter is set, and the transmission parameters are set in accordance with the transmission preset (S410, S415).

Next, the EOM operation is performed (S420). For example, the host device 100 may transmit a command for requesting the EOM operation to the memory device 200 so that the memory device 200 may perform the EOM operation.

Next, the EOM performance result is read (S425). If the EOM performance result is less than the EOM threshold value (S430—Y), the transmission preset is used and the phy training is ended (S435).

If the EOM performance result is equal to or higher than the EOM threshold value (S430—N), it is determined

TABLE 1

| | | |
|---|---|---|
| When width of path zone is w, s1 | If w ≤ 480, s1 = 0 | If w > 480, s1 = w |
| When height of path zone is h, s2 | If h ≤ 40, s2 = 0 | If h > 40, s2 = h |
| When number of path grids of path zone is gn, s3 | s3 = gn/10 | | whether the EOM performance result is smaller than the receiver tuning threshold value (S440).

If the EOM performance result is not less than the receiver tuning threshold value (S440—N), it is determined that this may be solved by the transmission parameter tuning, and the transmission preset of the transmitter is changed and set (S445). Further, the EOM operation is performed using the changed transmission preset (S420).

If the EOM performance result is less than the receiver tuning threshold value (S440—Y), it is determined that the reception parameter tuning is also required, the reception preset of the receiver is set, and the reception parameter is set in accordance with the reception preset (S450, S455).

Further, the EOM operation is performed (S460). Further, the EOM performance result is read (S465). If the EOM performance result is less than the EOM threshold value (S470—Y), the reception preset is used, and the phy training is ended (S475).

If the EOM performance result is equal to or greater than the EOM threshold value (S470—N), it is determined whether all the reception presets are used (S480). If all the reception presets are not used (S480—N), the reception presets of the receiver are changed and set (S485). Further, the EOM operation is performed using the changed reception preset (S455, S460).

If all the reception presets are used (S480—Y), transmission presets of the transmitter are changed and set (S445). Further, the EOM operation is performed using the changed transmission preset (S420).

Figure 22:
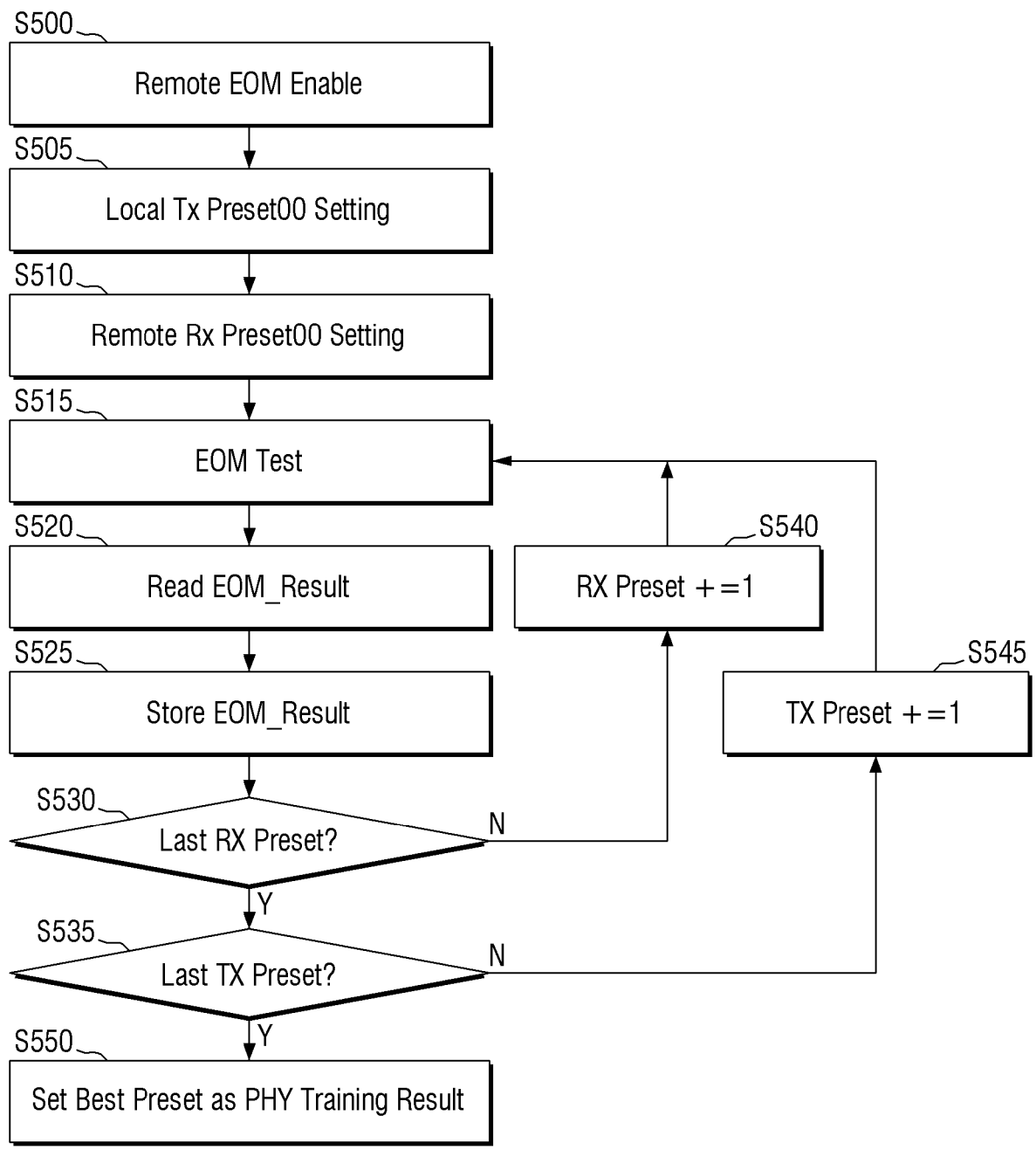
FIG. 22 is a flowchart that illustrates phy training operations according to some other embodiments of the inventive concept.

FIG. 22 is a flowchart that illustrates a phy training operation according to some other embodiments of the inventive concept.

In these embodiments, a method of setting the transmission preset and the reception preset independently without setting the transmission preset and the reception preset as a pair will be described.

Referring to FIG. 22, the EOM operation is prepared (S500). For example, the host device 100 may cause the memory device 200 to prepare the EOM operation.

Next, an initial transmission preset is set (S505). Further, an initial reception preset is set (S510).

Next, the EOM operation is performed (S515). For example, the host device 100 may transmit a command for requesting the memory device 200 to perform the EOM operation so that the memory device 200 may perform the EOM operation.

Next, the EOM performance result is read (S520). Further, the EOM performance result is stored (S525).

Next, it is determined whether the reception preset is a last reception preset (S530). If the reception preset is not the last reception preset (S530—N), the reception preset is changed and the EOM operation is performed (S510, S515). If the reception preset is the last reception preset (S530—Y), it is determined whether the transmission present is a last transmission preset (S535). If the transmission present is not the last transmission preset (S535—N), the transmission preset is changed and the EOM operation is performed (S505, S515). If the transmission present is the last transmission preset (S535—Y), an optimum preset (e.g., a preset having the highest score among the presets) is set as the phy training result (S550).

Figure 23:
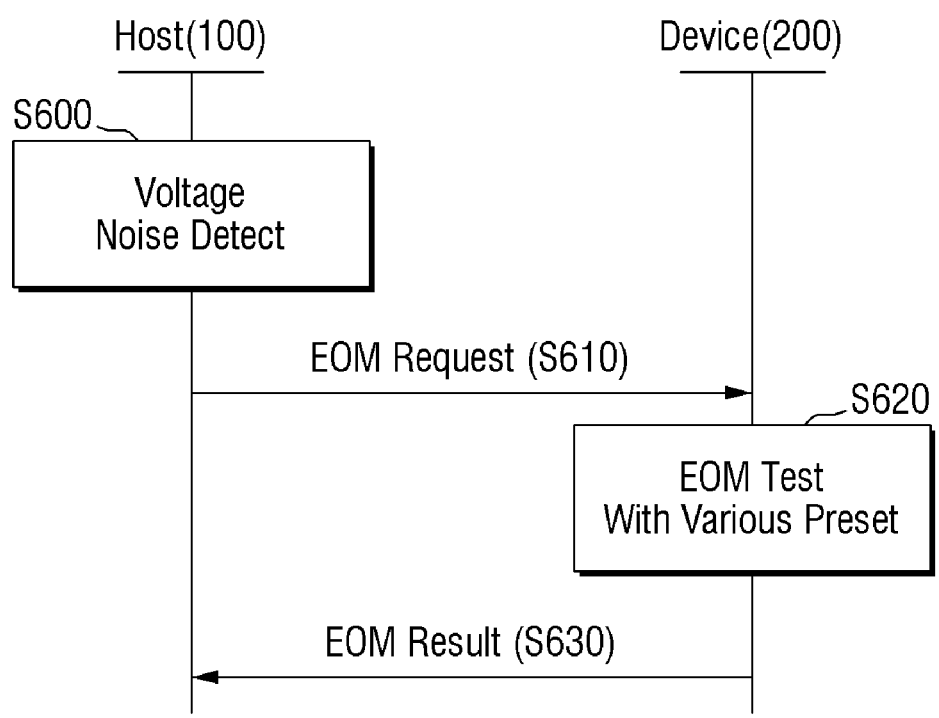
FIG. 23 is a flowchart that illustrates a preset changing method according to some embodiments of the inventive concept.
Figure 24:
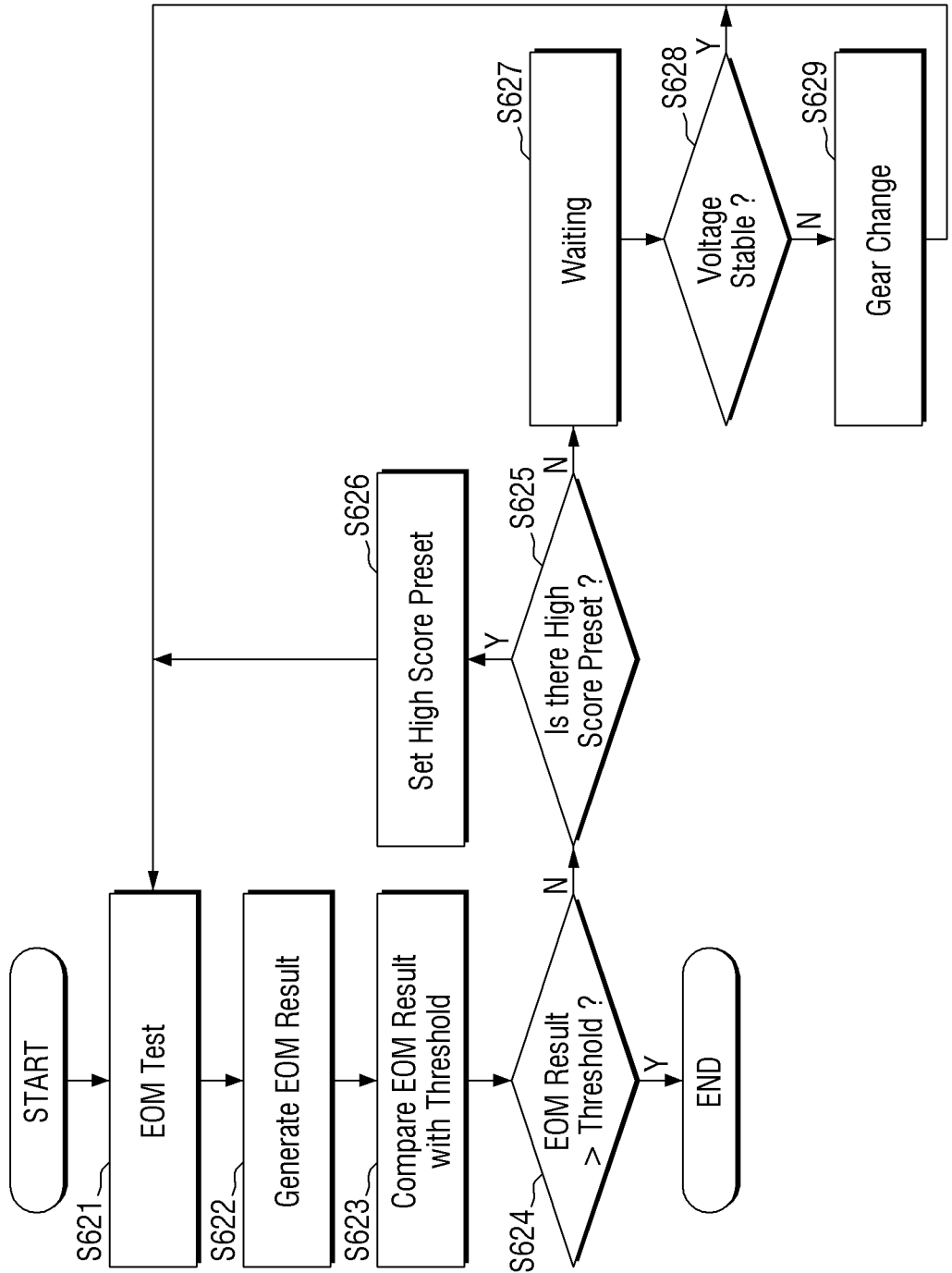
FIG. 24 is a diagram that illustrates the preset changing method of FIG. 23 according to some embodiments of the inventive concept.

FIG. 23 is a flowchart that illustrates a preset changing method according to some embodiments of the inventive concept. FIG. 24 is a diagram that illustrates the preset changing method of FIG. 23 according to some embodiments of the inventive concept.

Referring to FIG. 23, the host device 100 detects that a change in voltage supplied to the memory device 200 deviates from a predetermined reference (S600).

In this way, when the change in voltage supplied to the memory device 200 deviates from a predetermined reference, there is a risk of deterioration of the communication quality in the data communication between the host device 100 and the memory device 200. Accordingly, it may be necessary to actively change the preset to maintain the quality of the communication channel.

In some embodiments, the host device 100 may detect that the change in voltage supplied to the memory device 200 deviates from a predetermined reference value, by detecting that a noise of voltage supplied to the memory device 100 through a voltage noise detector of the PMIC deviates from a Voltage Input Tolerance Spec at a level of 90%. Further, in some embodiments, the host device 100 may detect that the change in voltage supplied to the memory device 200 deviates from a predetermined reference value, by periodically monitoring a register in which information about power is stored. However, the embodiments are not limited thereto.

Referring again to FIG. 23, after detecting that the change in voltage supplied to the memory device 200 deviates from a predetermined reference value, the host device 100 transmits the command of requesting the EOM operation performance to the memory device 200 (S610). The memory device 200 performs the EOM operation in response to this request, and performs the EOM operation using the changed preset, if necessary (S620). Further, the memory device 200 transmits a response signal including the changed preset information to the host device 100 (S630).

Hereinafter, an operation in which the preset is changed in response to the change in voltage supplied to the memory device 200 deviating from the predetermined reference value will be described more specifically referring to FIG. 24.

Referring to FIG. 24, the EOM operation is performed by the currently set preset (S621). Also, after generating the EOM result (S622), the EOM result is compared with the threshold value (S623).

If the EOM result is greater than the threshold value (for example, if the score is higher than the threshold value score) (S624—Y), because it is determined that there is no problem continuing the data communication using the currently set preset, the preset change is stopped. At this time, if there is changed preset information, it may be sent to the changed host device 100.

If the EOM result is equal to or less than the threshold value (for example, if the score is equal to or less than the threshold value score) (S624—N), because it is determined to be difficult to continue the data communication using the currently set preset, it is checked whether there is a preset of a higher score (S625).

If there is a preset having a higher score than the currently set preset (S625—Y), the preset is set (S626) to the preset having the higher score, and the EOM operation is performed again (S621). At this time, the newly set preset information is sent to the host device 100 and may be used to set the transmission parameters of the host device 100.

If there is no preset having a higher score than the currently set preset (S625—N), waiting is performed for a certain period of time (S627). Further, after waiting for a certain period of time, it is checked whether the voltage supplied to the memory device 200 is stabilized (S628).

If the voltage supplied to the memory device 200 is stabilized after waiting for a certain period of time (S628—Y), the EOM operation is performed again using the set preset (S621).

If the voltage supplied to the memory device 200 is not stabilized (S628—N) even after waiting for a certain period of time, the host device 100 is requested to change the gear (S629). Further, the EOM data is received by the changed gear and the EOM operation is performed again (S621).

In some embodiments, although the memory device 200 may require the host device 100 to change the UFS M-PHY gear, the embodiments are not limited thereto.

Figure 28:
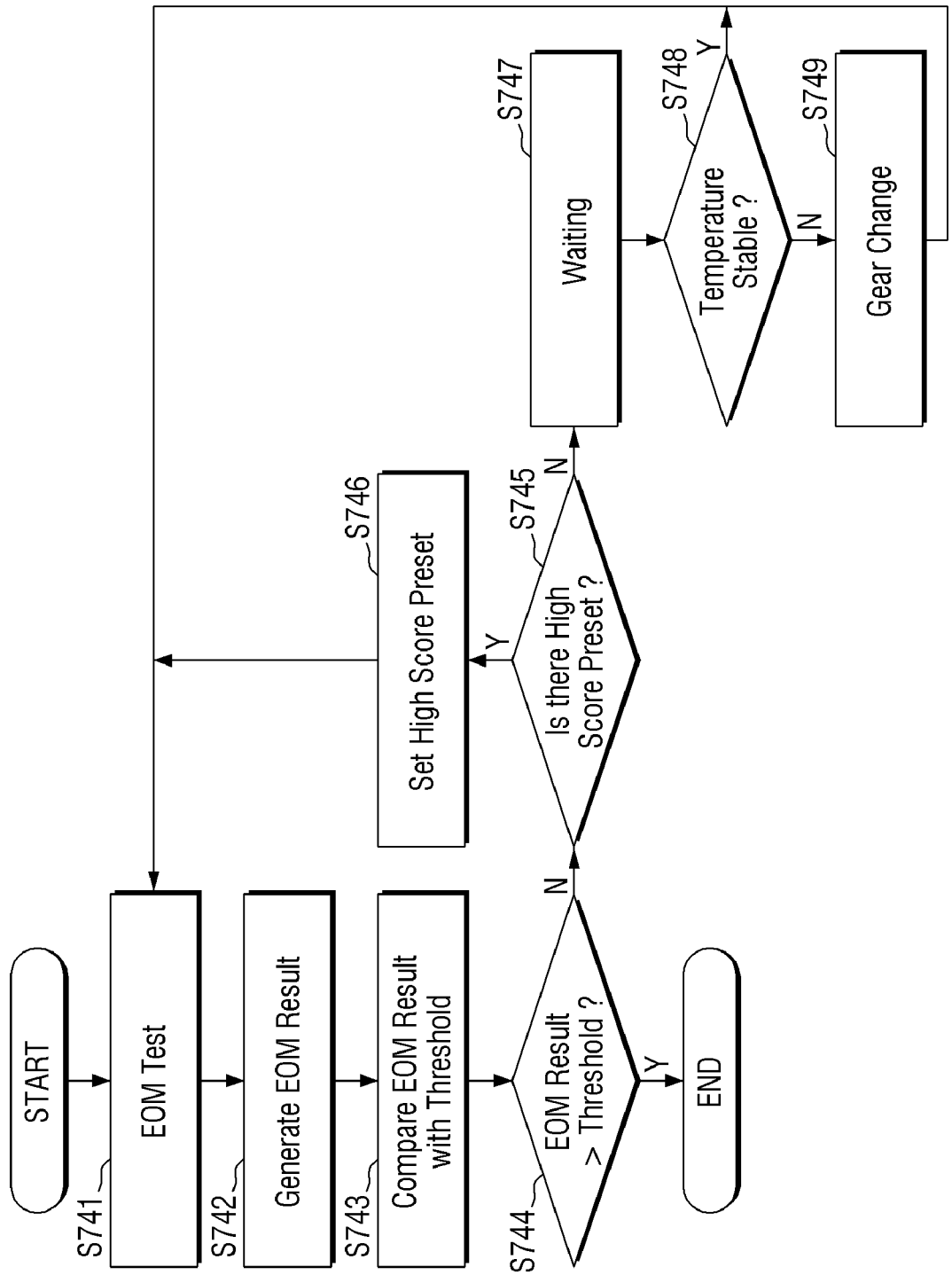

FIG. 25 is a flowchart that illustrates a preset changing method according to some embodiments of the inventive concept. FIGS. 26 to 28 are diagrams that illustrate the preset changing method of FIG. 25.

Referring to FIG. 25, the host device 100 receives an event response from the memory device (S700).

In some embodiments, although the event response may include, for example, a bit value indicating EVENT_ALERT of a Response UPIU shown in FIG. 26, the embodiments are not limited thereto.

The host device 100, which receives the event response from the memory device 200, reads a predetermined attribute value (S710).

In some embodiments, although the host device 100 may check wExceptionEventStatus shown in FIG. 27 of the event response, the embodiments are not limited thereto.

As a checking result of wExceptionEventStatus, if it is determined that the memory device 100 operates at a predetermined first temperature or lower (operates at too low temperature) or operates at a predetermined second temperature or higher (operates at too high temperature) (S720—Y), there is a risk of deterioration of the communication quality in the data communication between the host device 100 and the memory device 200. Accordingly, it may be necessary to actively change the preset and keep the communication quality in good condition. Therefore, the host device 100 may transmit a command for requesting the EOM operation to the memory device 200 (S730).

The memory device 200 performs the EOM operation in response to this request, and performs the EOM operation using the changed preset, if necessary (S740). Further, the memory device 200 transmits a response signal including the changed preset information to the host device 100 (S750).

As a checking result of wExceptionEventStatus, if the memory device 100 does not operate at a predetermined first temperature or lower (operates at too low temperature) or does not operate at a predetermined second temperature or higher (operates at too high temperature) (S720—N), because there is no need for another preset change, the preset change operations may be ended.

Hereinafter, an operation in which the preset is changed in response to the situation in which the memory device 100 operates below at the predetermined first temperature or lower (operates at too low temperature) or operates at the predetermined second temperature or higher (operates at too high temperature) will be described more specifically referring to FIG. 28.

Referring to FIG. 28, the EOM operation is performed using the currently set preset (S741). Also, after generating the EOM result (S742), the EOM result is compared with the threshold value (S743).

If the EOM result is greater than the threshold value (for example, if the score is higher than the threshold value score) (S744—Y), because it is determined that there is no problem continuing the data communication using the currently set preset, the preset change operations are stopped. At this time, if there is changed preset information, it may be sent to the changed host device 100.

If the EOM result is equal to or less than the threshold value (for example, if the score is equal to or less than the threshold value score) (S744—N), because it is determined to be difficult to continue the data communication using the currently set preset, it is checked whether there is a preset of a higher score (S745).

If there is a preset of a higher score than the currently set preset (S745—Y), the preset is set (S746) to the preset with the higher score, and the EOM operation is performed again (S741). At this time, the newly set preset information is sent to the host device 100 and may be used to set the transmission parameters of the host device 100.

If there is no preset of a higher score than the currently set preset (S745—N), waiting is performed for a certain period of time (S747). Further, after waiting for a certain period of time, it is checked whether the temperature of the memory device 200 is stabilized (S748).

If the temperature of the memory device 200 is stabilized after waiting for a certain period of time (S748—Y), the EOM operation is performed again using the set preset (S741).

If the temperature of the memory device 200 is not stabilized (S748—N) even after waiting for a certain period of time, the host device 100 is requested to change the gear (S749). Further, the EOM data is received with the changed gear and the EOM operation is performed again (S741).

In some embodiments, although the memory device 200 may require the host device 100 to change the UFS M-PHY gear, the embodiments are not limited thereto.

Figure 29:
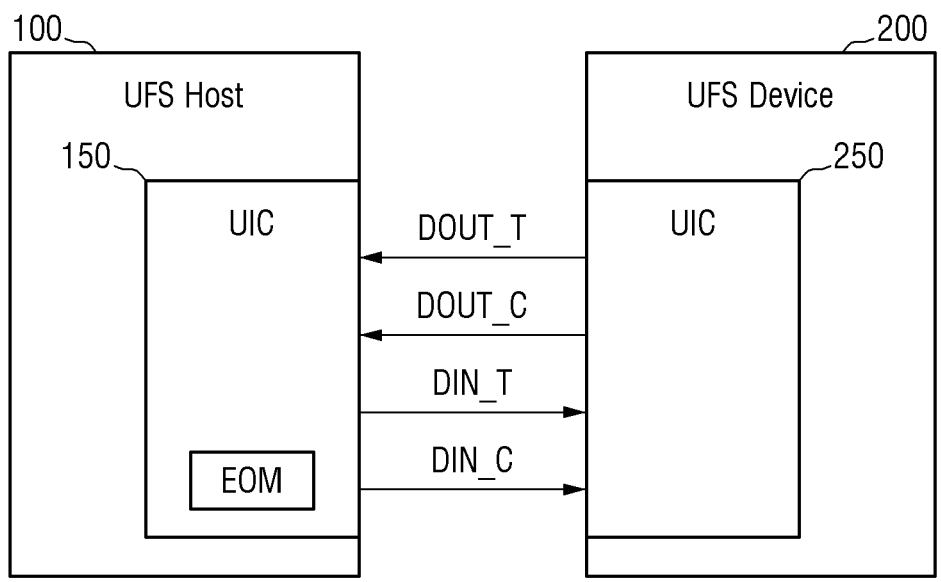
FIG. 29 is a diagram that illustrates a memory system according to some other embodiments of the inventive concept.

FIG. 29 is a diagram showing a memory system according to some other embodiments of the inventive concept. Hereinafter, differences from the above-described embodiments will be mainly described.

Referring to FIG. 29, in this embodiment, the UIC layer 150 of the host device 100 performs the above-mentioned EOM operation. For example, the UIC layer 150 of the host device 100 may perform the EOM operation on the differential output signal pairs DOUT_T and DOUT_C received from the memory device 200.

Figure 30:
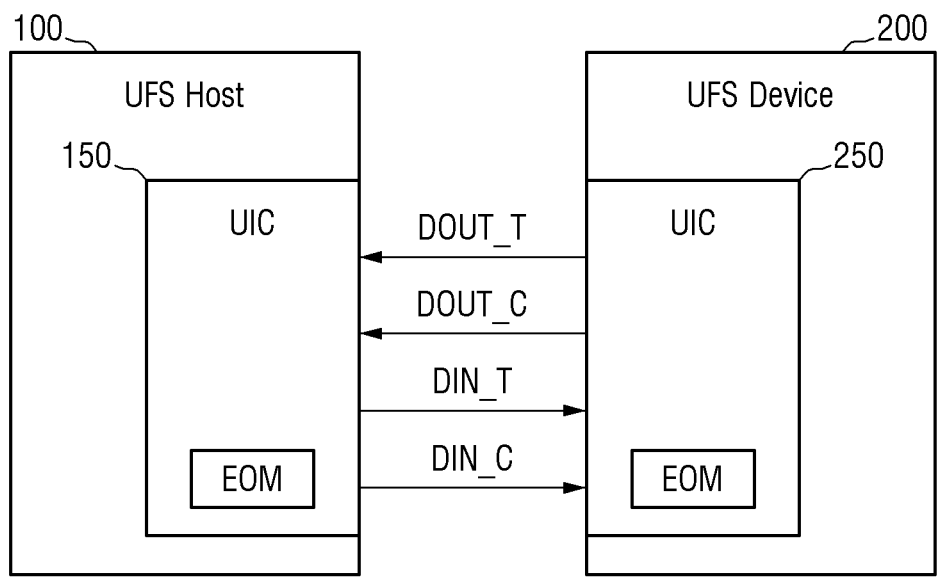
FIG. 30 is a diagram that illustrates a memory system according to some other embodiments of the inventive concept.

FIG. 30 is a diagram showing a memory system according to some other embodiments of the inventive concept. Hereinafter, differences from the above-described embodiments will be mainly described.

Referring to FIG. 30, in this embodiment, both the UIC layer 150 of the host device 100 and the UIC layer 250 of the memory device 200 perform the aforementioned EOM operation.

Figure 31:
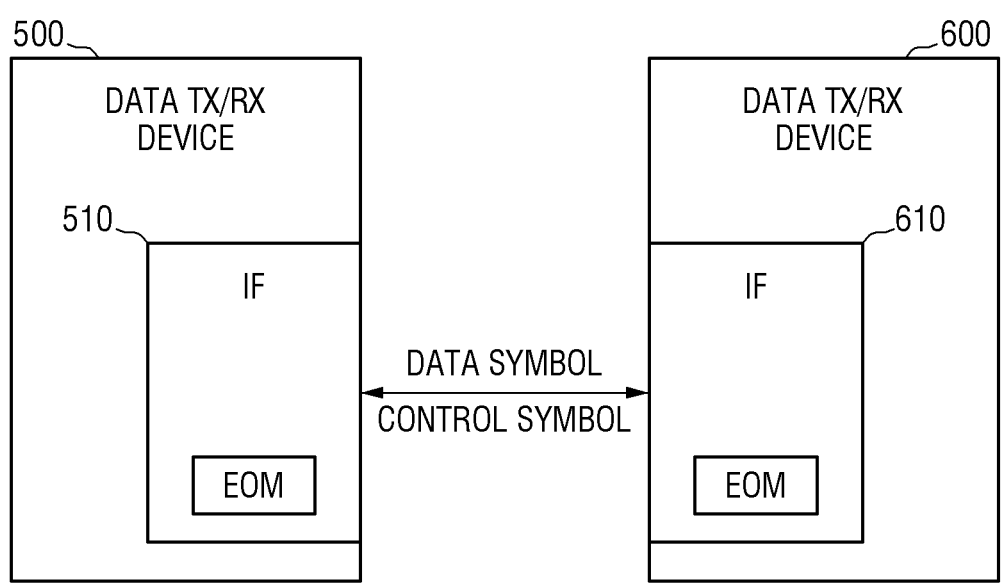
FIG. 31 is a diagram that illustrates a data transmission and reception system according to some embodiments of the inventive concept.

FIG. 31 is a diagram showing a data transmission and reception system according to some embodiments of the inventive concept.

Referring to FIG. 31, a first data transmission and reception device 500 includes a first interface 510. A second data transmission and reception device 600 includes a second interface 610.

The first interface 510 and the second interface 610 may perform the aforementioned EOM operations according to some embodiments of the inventive concept.

In some embodiments, the first data transmission and reception device 500 may be a camera module, and the second data transmission and reception device 600 may be an application processor. Further, in some embodiments, the first data transmission and reception device 500 may be a display driver IC, and the second data transmission and reception device 600 may be a display panel. In addition, the first data transmission and reception device 500 and the second data transmission and reception device 600 may be modified into various electronic devices (not shown).

Figure 32:
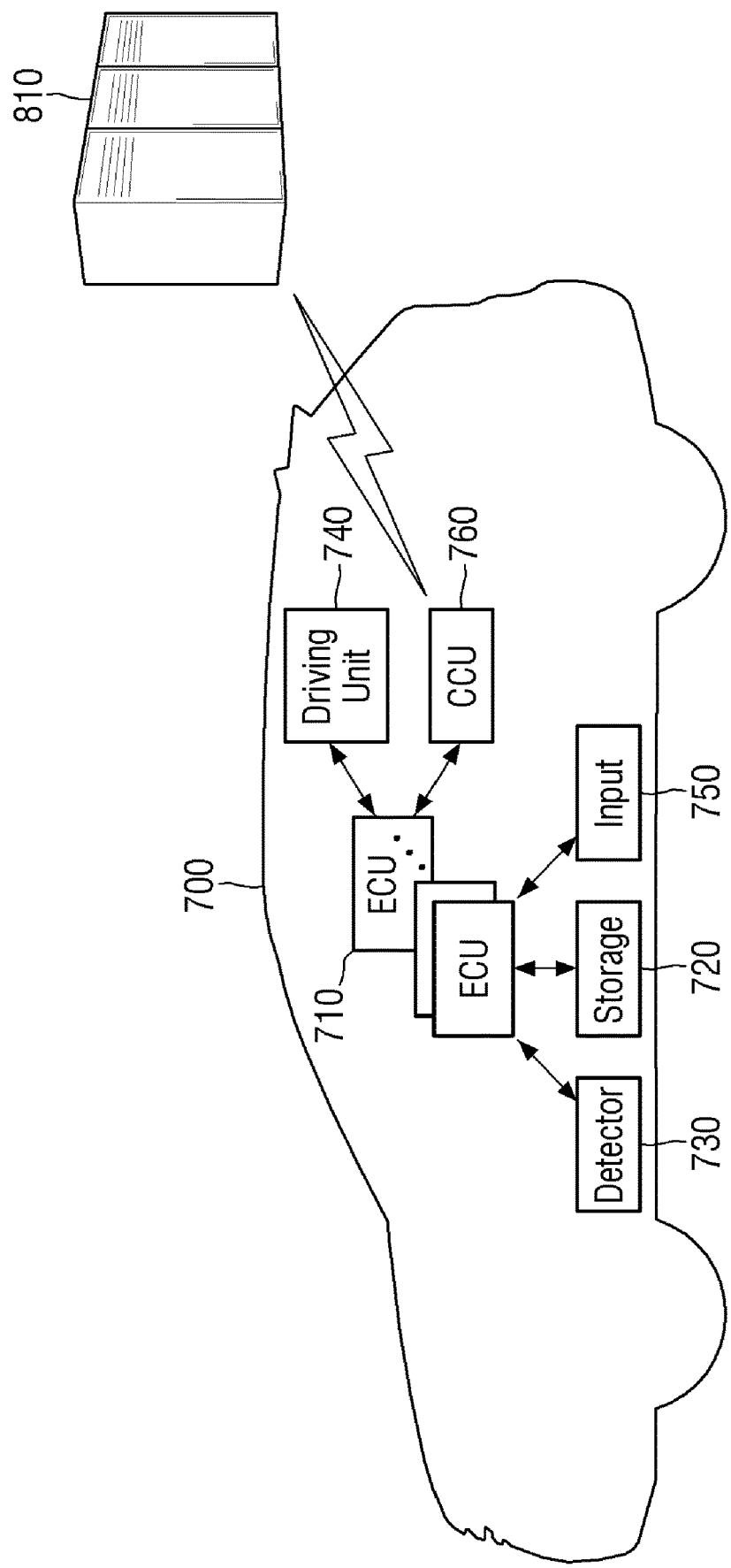
FIG. 32 is a diagram illustrating a vehicle in which a memory system according to some embodiments of the inventive concept is used.

FIG. 32 is a diagram showing a vehicle equipped with a memory system according to some embodiments.

A vehicle 700 may include a plurality of electronic control units (ECU) 710 and a storage device 720.

Each electronic control unit of the plurality of electronic control units 710 is electrically, mechanically, and communicatively connected to at least one of the plurality of devices provided in the vehicle 700, and may control operation of at least one device on the basis of any one function performance command.

Here, the plurality of devices may include an acquisition device 730 that is configured to acquire information used to perform at least one function, and a driving unit 740 that is configured to perform at least one function.

For example, the acquisition device 730 may include various detection units and image acquisition units, and the driving unit 740 may include a fan and a compressor of an air conditioner, a fan of a ventilator, an engine and a motor of a power unit, a motor of a steering unit, a motor and a valve of a braking unit, an opening and closing device of a door and a tailgate, and the like.

The plurality of electronic control units 710 may communicate with the acquisition device 730 and the driving unit 740, using, for example, at least one of an Ethernet, a low-voltage differential signaling (LVDS) communication, and a LIN (Local Interconnect Network).

When the plurality of electronic control units 710 determine whether there is a need to perform a function on the basis of the information acquired through the acquisition device 730, and when the determination is made of the need to perform the function, the electronic control units 710 control the operation of the driving unit 740 that performs that function, and may control an operation based on the acquired information. At this time, the plurality of electronic control units 710 may store the acquired information in the storage device 720 or read and use the information stored in the storage device 720. When the temperature of the vehicle 700 deviates from a predetermined range or the change in voltage provided to the storage device 720 deviates from a predetermined range, the plurality of electronic control units 710 and the storage device 720 may change the preset through the aforementioned operations in accordance with various embodiments of the inventive concept.

The plurality of electronic control units 710 may also be configured to control the operation of the driving unit 740 which performs that function on the basis of the function performance command that is input through the input unit 730, and may also be configured to check the setting amount corresponding to the information input through the input unit 730 and control the operation of the driving unit 740 which performs that function on the basis of the checked setting amount.

Each electronic control unit 710 may be configured to control any one function independently or may be configured to control any one function in association with other electronic control units.

For example, if a distance to an obstacle detected through a distance detection unit is within a reference distance, an electronic control unit of a collision prevention device may output a warning sound for a collision with the obstacle through a speaker.

An electronic control unit of an autonomous driving control device may be configured to receive navigation information, road image information, and distance information to the obstacle in association with an electronic control unit of a vehicle terminal, an electronic control unit of an image acquisition unit, and the electronic control unit of the collision prevention device, and may be configured to control a power unit, the braking unit, and the steering unit by the use of the received information, thereby performing the autonomous driving.

A connectivity control unit (CCU) 760 is electrically, mechanically, and communicatively connected to each of a plurality of electronic control units 710, and communicates with each of the plurality of electronic control units 710.

That is, the connectivity control unit 760 is able to directly communicate with a plurality of electronic control units 710 provided inside the vehicle, is also able to communicate with an external server, and is also able to communicate with an external terminal through the interface.

The connectivity control unit 760 may communicate with a plurality of electronic control units 710, and may communicate with the server 810, using an antenna (not shown) and a RF communication.

Further, the connectivity control unit 760 may communicate with the server 810 by wireless communication. The wireless communication between the connectivity control unit 760 and the server 810 is enabled through various wireless communication standards or protocols, such as a GSM (global System for Mobile Communication), a CDMA (Code Division Multiple Access), a WCDMA (Wideband Code Division Multiple Access), a UMTS (universal mobile telecommunications system), a TDMA (Time Division Multiple Access), and a LTE (Long Term Evolution), in addition to a Wifi module and a wireless broadband module.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A method for operating a host device, the method comprising:
   detecting a need to perform an EOM (Eye Open Monitor) operation;
   transmitting a command requesting the EOM operation to a memory device in response to the detection of the need to perform the EOM operation;
   receiving a response signal including changed preset information from the memory device; and
   operating the host device using signal driving characteristics that are changed based on the changed preset information.

2. The method for operating the host device of claim 1, wherein the detection of the need to perform the EOM operation includes detecting that a change in voltage supplied to the memory device deviates from a predetermined reference value.

3. The method for operating the host device of claim 1, wherein the detection of the need to perform the EOM operation includes receiving provision of an event response from the memory device, and detecting the need to perform the EOM operation performance based on the provision of event response.

4. The method for operating the host device of claim 3, wherein the event response includes information indicating that the memory device operates at a predetermined first temperature or lower or operates at a predetermined second temperature or higher.

5. The method for operating the host device of claim 1, wherein the command requesting the EOM operation includes a WRITE BUFFER COMMAND.

6. The method for operating the host device of claim 5, wherein a mode (MODE) field of the WRITE BUFFER COMMAND is set to 0x1F.

7. The method for operating the host device of claim 1, further comprising:
   detecting that the memory device is powered on; and
   transmitting a plurality of commands for requesting the EOM operation to the memory device so that the memory device performs a plurality of EOM operations by a plurality of presets.

8. A method for operating a memory device, the method comprising:
   receiving a first command for requesting a first EOM operation from a host device;
   performing the first EOM operation by a currently set preset;
   performing a second EOM operation after changing the currently set preset to a first preset in response to a performance result of the first EOM operation being equal to or less than a predetermined reference value;
   transmitting a response signal including the first preset to the host device; and
   operating the memory device using signal driving characteristics that are changed based on the first preset.

9. The method for operating the memory device of claim 8, wherein the performance of the second EOM operation after changing the currently set preset to the first preset includes:
   transmitting the changed first preset to the host device, and
   receiving a second command for requesting the second EOM operation from the host device and performing the second EOM operation.

10. The method for operating the memory device of claim 8, further comprising:
    searching whether there is a preset having a higher score than the currently set preset in response to the performance result of the first EOM operation being equal to or less than the predetermined reference value; and
    setting the first preset to the preset having the higher score than the currently set preset.

11. The method for operating the memory device of claim 10, further comprising:
    requesting the host device to change gear when there is no preset having the higher score than the currently set preset.

12. The method for operating the memory device of claim 11, further comprising:
    waiting for a certain period of time when there is no preset having the higher score than the currently set preset;
    after waiting for the certain period of time, determining whether at least one of a voltage and a temperature is stabilized; and
    requiring the host device to change gear when at least one of the voltage and the temperature is not stabilized.

13. The method for operating the memory device of claim 8, wherein the first command for requesting the first EOM operation includes a WRITE BUFFER COMMAND.

14. The method for operating the memory device of claim 13, wherein a mode (MODE) field of the WRITE BUFFER COMMAND is set to 0x1F.

15. The method for operating the memory device of claim 8, further comprising:
    transmitting an event response to the host device,
    wherein the command for requesting the first EOM operation is received based on the event response.

16. The method for operating the memory device of claim 15, wherein the event response includes information indicating that the memory device operates at a predetermined first temperature or lower or operates at a predetermined second temperature or higher.

17. The method for operating the memory device of claim 8, further comprising:
    performing a third EOM operation by a second preset;
    storing a first score of the second preset based on one or more of a height, a width, number of path grids, and a vertical intermediate value of a first path zone calculated as a performance result of the third EOM operation;
    performing a fourth EOM operation by a third preset;
    storing a second score of the third preset based on one or more of a height, a width, number of path grids, and a vertical intermediate value of a second path zone calculated as a performance result of the fourth EOM operation; and
    setting the currently set preset to a preset having a higher score among the first score and the second score.

18. A vehicle comprising:
    an electronic control unit; and
    a memory device configured to receive and store data from the electronic control unit,
    wherein the memory device is configured to provide the electronic control unit with a response including information indicating that the memory device operates at a predetermined first temperature or lower or operates at a predetermined second temperature or higher,
    wherein the memory device is configured to receive a first command for requesting a first EOM operation from the electronic control unit,
    wherein the memory device is configured to perform the first EOM operation by a currently set preset,
    wherein the memory device is configured to change the currently set preset to a first preset, and then to perform a second EOM operation in response to a performance result of the first EOM operation being equal to or less than a predetermined reference value,
    wherein the memory device is configured to transmit a response signal including the first preset information to the electronic control unit, and
    operating the electronic control unit or operating the memory device using signal driving characteristics of the electronic control unit or the memory device, respectively, that are changed based on the first preset.

19. The vehicle of claim 18, wherein the memory device is configured to search whether there is a preset having a higher score than the currently set preset in response to the performance result of the first EOM operation being equal to or less than the predetermined reference value, and
    wherein the memory device is configured to set the first preset to the preset having the higher score than the currently set preset.

20. The vehicle of claim 19, wherein the memory device is configured to transmit the changed first preset to the electronic controller, and wherein the memory device is configured to receive a second command for requesting the second EOM operation from the electronic control unit and to perform the second EOM operation.

* * * * *